United States Patent
Fujii et al.

(10) Patent No.: US 9,012,294 B2
(45) Date of Patent: Apr. 21, 2015

(54) MANUFACTURING METHOD OF NON-VOLATILE MEMORY DEVICE

(75) Inventors: Satoru Fujii, Osaka (JP); Takumi Mikawa, Shiga (JP); Haruyuki Sorada, Okayama (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 87 days.

(21) Appl. No.: 13/812,227

(22) PCT Filed: Jul. 26, 2011

(86) PCT No.: PCT/JP2011/004207
§ 371 (c)(1),
(2), (4) Date: Jan. 25, 2013

(87) PCT Pub. No.: WO2012/014447
PCT Pub. Date: Feb. 2, 2012

(65) Prior Publication Data
US 2013/0122651 A1 May 16, 2013

(30) Foreign Application Priority Data

Jul. 27, 2010 (JP) .................................. 2010-168413

(51) Int. Cl.
*H01L 45/00* (2006.01)
*H01L 21/20* (2006.01)
(Continued)

(52) U.S. Cl.
CPC .......... *H01L 45/1616* (2013.01); *H01L 45/124* (2013.01); *H01L 45/145* (2013.01);
(Continued)

(58) Field of Classification Search
CPC .............. H01L 27/101; H01L 27/2463; H01L 45/1233; H01L 45/1616; H01L 45/146
USPC ......................................................... 438/382
See application file for complete search history.

(56) References Cited

U.S. PATENT DOCUMENTS

2002/0058423 A1  5/2002  Heo et al.
2002/0106451 A1  8/2002  Skarp et al.
(Continued)

FOREIGN PATENT DOCUMENTS

EP  1 531 191 A2  5/2005
EP  2 154 689 A2  2/2010
(Continued)

OTHER PUBLICATIONS

International Search Report issued in International Patent Application No. PCT/JP2011/004207 dated Nov. 8, 2011.
(Continued)

*Primary Examiner* — Su C Kim
*Assistant Examiner* — Regan J Rundio
(74) *Attorney, Agent, or Firm* — McDermott Will & Emery LLP

(57) ABSTRACT

Each of the step of forming a first variable resistance layer (18a) and the step of forming a second variable resistance layer (18b) includes performing a cycle once or plural times, the cycle consisting of a first step of introducing a source gas composed of molecules containing atoms of a transition metal; a second step of removing the source gas after the first step; a third step of introducing a reactive gas to form a transition metal oxide after the second step; and a fourth step of removing the reactive gas after the third step. The step of forming the first variable resistance layer (18a) is performed in a state in which the substrate is kept at a temperature at which a self-decomposition reaction of the source gas does not occur. One or plural of conditions used for forming the second variable resistance layer (18b) is/are made different from the one or plural conditions used for forming the first variable resistance layer (18a), the conditions being the temperature of the substrate, an amount of the introduced source gas and an amount of the introduced reactive gas.

9 Claims, 21 Drawing Sheets

(51) Int. Cl.
   *H01L 27/10*   (2006.01)
   *H01L 27/24*   (2006.01)

(52) U.S. Cl.
   CPC .......... *H01L 27/101* (2013.01); *H01L 27/2418* (2013.01); *H01L 27/2463* (2013.01); *H01L 27/2481* (2013.01); *H01L 45/08* (2013.01); *H01L 45/1233* (2013.01); *H01L 45/146* (2013.01); *H01L 27/2409* (2013.01)

(56) References Cited

U.S. PATENT DOCUMENTS

| | | |
|---|---|---|
| 2003/0000473 A1 | 1/2003 | Chae et al. |
| 2004/0151845 A1 | 8/2004 | Nguyen et al. |
| 2004/0197476 A1 | 10/2004 | Skarp et al. |
| 2005/0112874 A1 | 5/2005 | Skarp et al. |
| 2007/0065961 A1 | 3/2007 | Park et al. |
| 2009/0181549 A1 | 7/2009 | Yoneda et al. |
| 2009/0283736 A1 | 11/2009 | Kanzawa et al. |
| 2010/0090193 A1 | 4/2010 | Mikawa et al. |
| 2010/0181545 A1* | 7/2010 | Hsieh et al. ........................ 257/2 |
| 2010/0190353 A1 | 7/2010 | Nguyen et al. |
| 2010/0255217 A1* | 10/2010 | Park ............................. 427/576 |
| 2010/0288995 A1 | 11/2010 | Ozawa et al. |
| 2011/0008955 A1* | 1/2011 | Horii et al. .................... 438/608 |
| 2011/0294259 A1 | 12/2011 | Kanzawa et al. |
| 2012/0021138 A1 | 1/2012 | Ditizio et al. |
| 2012/0097915 A1* | 4/2012 | Mikawa et al. ................... 257/4 |
| 2012/0258257 A1 | 10/2012 | Nguyen et al. |
| 2012/0289061 A1 | 11/2012 | Nguyen et al. |

FOREIGN PATENT DOCUMENTS

| | | |
|---|---|---|
| GB | 2 355 727 A | 5/2001 |
| JP | 2010135581 A | 6/2010 |
| JP | 2010-153420 A | 7/2010 |
| WO | WO 2010064340 A1 * | 6/2010 |

OTHER PUBLICATIONS

H. Kim et al., "Applications of atomic layer deposition to nanofabrication and emerging nanodevices," Thin Solid Films, vol. 157, pp. 2563-2580 (2009).

B. J. Choi et al., "Resistive switching mechanism of TiO2 thin films grown by atomic-layer deposition," Journal of Applied Physics, vol. 98, pp. 033715 (2005).

Park et al., "Resistance Switching Characteristics for Nonvolatile Memory Operation of Binary Metal Oxides," Japanese Journal of Applied Physics, vol. 46, No. 4B, 2007, pp. 2172-2174.

Japanese Office Action issued in Japanese Patent Application No. 2012-526311 dated Aug. 16, 2013.

* cited by examiner

STATE A

STATE B

STATE C

STATE D

T · · · THICKNESS OF OXIDE LAYER IN UPPER END SURFACE
B · · · THICKNESS OF OXIDE LAYER IN HOLE BOTTOM PORTION
H · · · DEPTH OF HOLE
R · · · SIZE OF HOLE

ASPECT RATIO = H/R
BOTTOM COVERAGE = B/T
SIDE WALL COVERAGE = S/B

MANUFACTURING METHOD OF NON-VOLATILE MEMORY DEVICE

RELATED APPLICATIONS

This application is the U.S. National Phase under 35 U.S.C. §371 of International Application No. PCT/JP2011/004207, filed on Jul. 26, 2011, which in turn claims the benefit of Japanese Application No. 2010-168413, filed on Jul. 27, 2010, the disclosures of which Applications are incorporated by reference herein.

TECHNICAL FIELD

The present invention relates to a manufacturing method of a non-volatile memory device incorporating variable resistance elements. More specifically, the present invention relates to a manufacturing method of a non-volatile memory device including a plurality of variable resistance layers which are different in oxygen content from each other, inside of each of memory cell holes.

BACKGROUND ART

In recent years, with progresses of digital technologies of electronic devices, development of memory devices which have higher capacities and are non-volatile have been made vigorously, to store data of music, images, information, and so on. For example, a non-volatile memory device incorporating ferroelectric as capacitive elements has already been practiced in many fields. In addition to the non-volatile memory device incorporating the ferroelectric as the capacitive elements, an attention has been paid to a non-volatile memory device (hereinafter referred to as ReRAM "Resistive RAM") incorporating a material which changes its resistance value in response to an electric pulse applied and preserves the changed state, because of high compatibility with normal semiconductor process steps.

Patent Literature 1 discloses a cross-point ReRAM including variable resistance layers formed inside of miniaturized holes arranged in matrix, respectively, to realize a smaller-size of memory elements and a higher capacity of a memory device.

As a process for filling layers into the miniaturized holes, an atomic layer deposition (ALD) method has been developed. A process for forming a metal oxide by the ALD method includes:
1) vaporizing a precursor material to provide a source gas containing metal atoms;
2) introducing the source gas into a vacuum chamber in which a substrate is placed, to form a metal mono-atomic layer on the substrate,
3) then introducing a purge gas to purge an unnecessary portion of the source gas,
4) then introducing a reactive gas such as $O_2$, $O_3$, or $H_2O$, to oxidize the metal mono-atomic layer and to remove ligand of metal,
5) finally introducing a purge gas to purge an unnecessary portion of the reactive gas, and forming a metal oxide layer, and
6) repeating a cycle consisting of the step 2) to the step 5), to form a metal oxide layer with a desired thickness.

The ALD method has a feature that a layer can be conformally grown into a miniaturized hole with a high aspect ratio, because the layer is grown for each mono-atomic layer.

Non-patent Literature 1 describes that the ALD method has been studied and developed as a process for a nano-device by utilizing the above feature.

Non-patent Literatures 2 and 3 report that a $TiO_2$ layer and a $HfO_2$ deposited by the ALD method exhibits a resistance changing phenomenon in response to electric pulses.

Patent Literature 2 discloses a variable resistance non-volatile memory element incorporating a NIO layer deposited by the ALD method which is able to form a layer which is thin, less in defective, and dense, which memory element is intended to reduce a leak current and improve a resistance changing characteristic.

Patent Literature 3 discloses a variable resistance element including two variable resistance layers which are different in oxygen content from each other.

CITATION LIST

Patent Literature

Patent Literature 1: International Publication No. 2008/47711
Patent Literature 2: Japanese Laid-Open Patent Application Publication No. 2007-84935
Patent Literature 3: International Publication No. 2008/149484

Non-Patent Literature

Non-patent Literature 1: Thin Solid Films Vol. 517 page 2563-2580, 2009
Non-patent Literature 2: Journal of Applied Physics Vol. 98 page 033715, 2005
Non-patent Literature 3: Japanese Journal of Applied Physics Vol. 46 No. 4B page 2172-2174, 2007

SUMMARY OF INVENTION

Technical Problem

In some occasions, it was difficult to form two variable resistance layers which are different in oxygen content from each other into a hole. The present invention is directed to solving the above described problem, and an object of the present invention is to form two variable resistance layers which are different in oxygen content from each other into a hole more easily than a conventional manufacturing method.

Solution to Problem

The present inventors intensively studied a method of forming a variable resistance layer having a two-layer structure of a higher resistance layer and a lower resistance layer into a miniaturized hole, and discovered the followings.

As a typical method of forming variable resistance layers which are different in oxygen content from each other into a memory cell hole, there is a sputtering method. However, it was revealed that it became difficult to fill the variable resistance layers into the memory cell hole by the sputtering method as an aspect ratio of the memory cell hole increased.

By way of example, description will be hereinafter given of a result of the present inventors' study for a case where a tantalum oxide ($TaO_x$) was deposited into a memory hole having a diameter of 80~240 nm and a depth of 250 nm, by a DC sputtering method.

FIG. 18 is a conceptual view of "aspect ratio" and "bottom coverage" in conjunction with the present inventors' study. The aspect ratio is defined as FUR derived by dividing H by R when a depth of the hole is H and a size (diameter) of the hole is R. As the aspect ratio is greater, the hole has a greater lengthwise dimension. The bottom coverage is defined as B/T derived by dividing B by T when a thickness of an oxide layer in a bottom portion of the hole is B and a thickness of an oxide layer in the upper end surface is T. The fact that the bottom coverage is greater means that the oxide layer is formed such that an oxide is filled fully so as to conform in shape to the bottom portion of the hole. In other words, the fact that the bottom coverage is greater means that the oxide layer is formed more conformally.

In this study, to allow particles generated by the sputtering to spread to a wider region of the inside of the hole, a distance between a target and the substrate was set to a value as great as 300 nm, and in this way, the particles incident on the substrate were caused to travel as linearly as possible. To increase the aspect ratio, an attempt was made to electrically induce the particles into the hole by applying a DC bias power (200 W) to the substrate. FIG. 19 shows results obtained under the above stated conditions.

It was found out that the bottom coverage in a case where the bias power was not applied to the substrate depended greatly on the aspect ratio. Especially, in a case where the aspect ratio was near 1.5, the bottom coverage was merely as small as about 10%. Therefore, it was presumed that it was difficult to fill the oxide layer conformally into the hole with a greater aspect ratio.

On the other hand, in a case where the bias power was applied to the substrate, the bottom coverage was improved a little as compared to the case where the bias power was not applied to the substrate. However, the bottom coverage was still as small as about 20%. It was presumed that it was difficult to fill the oxide layer conformally into the hole with a greater aspect ratio.

By comparison, it is known that in a process using the ALD method, the oxide layer can be formed conformally into the hole with a greater aspect ratio. With further miniaturization of a process rule, the ALD method has been used in process steps for manufacturing a device. However, in a case where the oxide layer is deposited by the ALD method, it is difficult to deposit a desired oxygen-deficient oxide by controlling its oxygen content, and a method of depositing a stacked-layer structure in which a plurality of oxides which are different from each other in oxygen content are stacked together is not known yet.

The recognition of the above stated problem was a beginning of conception of the present invention. The present inventors further studied, and discovered that the oxygen contents of the oxide layers could be controlled by controlling a supply amount of the reactive gas in a process using ALD method (see Experiment examples 1 to 3).

A method of manufacturing a non-volatile memory device, of the present invention, comprises the steps of: forming a first electrode on a substrate; forming an interlayer insulating layer on the first electrode; forming a memory cell hole in the interlayer insulating layer such that the memory cell hole penetrates the interlayer insulating layer and exposes the first electrode; forming a first variable resistance layer and a second variable resistance layer in this order inside of the memory cell hole, each of the first variable resistance layer and the second variable resistance layer comprising an oxygen-deficient transition metal oxide; and forming a second electrode on the second variable resistance layer; wherein each of the step of forming the first variable resistance layer and the step of forming the second variable resistance layer includes performing a cycle once or plural times, the cycle consisting of a first step of introducing a source gas composed of molecules containing atoms of a transition metal; a second step of removing the source gas after the first step; a third step of introducing a reactive gas to form the transition metal oxide after the second step; and a fourth step of removing the reactive gas after the third step; wherein the step of forming the first variable resistance layer is performed in a state in which the substrate is kept at a temperature at which a self-decomposition reaction of the source gas does not occur; and wherein the first variable resistance layer and the second variable resistance layer are formed in such a manner that one or plural of conditions used for forming the second variable resistance layer is/are made different from the one or plural conditions used for forming the first variable resistance layer, to make an oxygen content of the first variable resistance layer higher than an oxygen content of the second variable resistance layer, the conditions being the temperature of the substrate, an amount of the introduced source gas and an amount of the introduced reactive gas.

Advantageous Effects of the Invention

A manufacturing method of the non-volatile memory device of the present invention has an advantage that two variable resistance layers which are different from each other in oxygen content can be formed inside of a hole more easily than a conventional manufacturing method.

BRIEF DESCRIPTION OF THE DRAWINGS

FIG. 5B is a view showing steps of the manufacturing method of the non-volatile memory device according to Embodiment 1 of the present invention, and is a cross-sectional view after a step of forming a second variable resistance material layer 181b which will become second variable resistance layers 18b on the first variable resistance material layer 181a.

DESCRIPTION OF THE EMBODIMENTS

Figure 1A:
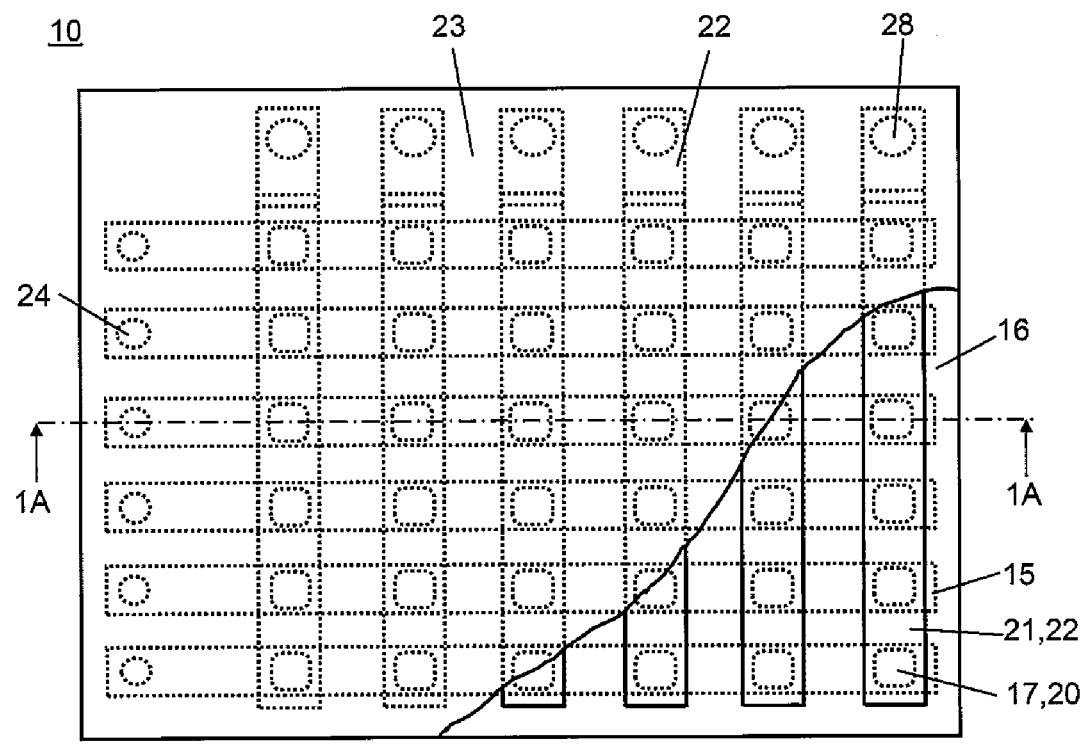
FIG. 1A is a plan view showing an exemplary schematic configuration of a non-volatile memory device 10 according to Embodiment 1 of the present invention.

Hereinafter, embodiments of the present invention will be described with reference to the drawings. The same components are designated by the same reference symbols and will not be described in repetition in some cases. Note that shapes of a transistor, a memory section, etc., are schematically drawn, and the number of them, etc., are set for easier illustration in the drawings.

According to a first aspect of the present invention, a method of manufacturing a non-volatile memory device, comprises the steps of: forming a first electrode on a substrate; forming an interlayer insulating layer on the first electrode; forming a memory cell hole in the interlayer insulating layer such that the memory cell hole penetrates the interlayer insulating layer and exposes the first electrode; forming a first variable resistance layer and a second variable resistance layer in this order inside of the memory cell hole, each of the first variable resistance layer and the second variable resistance layer comprising an oxygen-deficient transition metal oxide; and forming a second electrode on the second variable resistance layer; wherein each of the step of forming the first variable resistance layer and the step of forming the second variable resistance layer includes performing a cycle once or plural times, the cycle consisting of a first step of introducing a source gas composed of molecules containing atoms of a transition metal; a second step of removing the source gas after the first step; a third step of introducing a reactive gas to form the transition metal oxide after the second step; and a fourth step of removing the reactive gas after the third step; wherein the step of forming the first variable resistance layer is performed in a state in which the substrate is kept at a temperature at which a self-decomposition reaction of the source gas does not occur; and wherein the first variable resistance layer and the second variable resistance layer are formed in such a manner that one or plural of conditions used for forming the second variable resistance layer is/are made different from the one or plural conditions used for forming the first variable resistance layer, to make an oxygen content of the first variable resistance layer higher than an oxygen content of the second variable resistance layer, the conditions being the temperature of the substrate, an amount of the introduced source gas and an amount of the introduced reactive gas.

In accordance with the manufacturing method as described above, it becomes possible to form a stacked-layer structure of the variable resistance layer which is composed of two or more layers which are different from each other in oxygen content and has good bottom coverage, inside of the miniaturized hole, more easily than a conventional manufacturing method.

The "temperature at which a self-decomposition reaction of the source gas does not occur" refers to a temperature at which the self-decomposition reaction of molecules of the source gas does not occur and the molecules are adsorbed to form a mono-molecular layer. For example, in a case where TBTDET (TertiaryButylimido, Tris (DiEthylamino) Tantalum, Ta [N($C_2H_5$)$_2$]$_3$[=NC(CH$_3$)$_3$]) is used as the source gas, a temperature lower than 300 degrees C. is the temperature at which the self-decomposition reaction of the source gas does not occur, while a temperature equal to or higher than 300 degrees C. is the temperature at which the self-decomposition reaction of the source gas occurs. Deposition of a layer at the temperature at which the self-decomposition reaction of the source gas does not occur will be referred to as deposition in an ALD mode, while deposition of a layer at the temperature at which the self-decomposition reaction of the source gas occurs will be referred to as deposition in a CVD mode. That is, an ALD process includes the ALD mode and the CVD mode.

The "amount of the introduced reactive gas" relates to a controlled amount with which a speed of a reaction between a substrate surface and the reactive gas can be controlled in the ALD mode or the CVD mode. For example, the "amount of the introduced reactive gas" includes, for example, a composition, a supply time, a supply pressure, a supply volume, a supply weight, a supply flow rate, a supply mole number, or the like of the reactive gas.

The "oxygen content" refers to an oxygen content of oxygen-deficient transition metal oxide constituting the variable resistance layer, and is expressed as, for example, a ratio of a mole number of oxygen atoms with respect to a total of a mole number of transition metal atoms and the mole number of the oxygen atoms, in a transition metal oxide constituting each of resistance variable layers.

Each of the first variable resistance layer and the second variable resistance layer may comprise the oxygen-deficient transition metal oxide. Nonetheless, the first variable resistance layer may comprise a transition metal oxide which is not substantially oxygen-deficient. Even if an attempt is made to attain a composition of a transition metal oxide layer which is not stoichiometrically oxygen deficient, a little oxygen deficiency will occur. The first variable resistance layer may comprise such an oxygen-deficient transition metal oxide (transition metal oxide which is not substantially oxygen-deficient) with such a little oxygen deficiency.

According to the manufacturing method of the non-volatile memory device according to a second aspect of the present invention, in the method of manufacturing the non-volatile memory device according to the first aspect, the step of forming the first variable resistance layer and the step of forming the second variable resistance layer may be performed in succession within the same chamber.

In such a configuration, the variable resistance layer is not exposed to the air in a time period between the step of forming the first variable resistance layer and the step of forming the second variable resistance layer. This makes it possible to prevent the oxygen content of the first variable resistance layer from varying.

According to the manufacturing method of the non-volatile memory device according to a third aspect of the present invention, in the method of manufacturing the non-volatile memory device according to the first aspect or the second aspect, a total gas pressure within a chamber in the first step included in the step of forming the first variable resistance layer is lower than a total gas pressure within a chamber in the first step included in the step of forming the second variable resistance layer; and a total gas pressure within a chamber in the third step included in the step of forming the first variable resistance layer is lower than a total gas pressure within a chamber in the third step included in the step of forming the second variable resistance layer.

An aspect ratio of a hole is greater at a time point at which the first variable resistance layer is deposited than at a time point at which the second variable resistance layer is deposited. Because of this, it becomes difficult to enable the gas to adequately reach a bottom portion of the hole. In the above configuration, in the step of forming the first variable resistance layer, the gas can adequately reach the bottom portion of the hole easily, which makes it easier to form the first variable resistance layer conformally.

According to the manufacturing method of the non-volatile memory device according to a fourth aspect of the present invention, in the method of manufacturing the non-volatile memory device according to any one of the first to third aspects, an amount of the reactive gas introduced in the third step included in the step of forming the first variable resistance layer is greater than an amount of the reactive gas introduced in the third step included in the step of forming the second variable resistance layer.

Since the oxygen content of the first variable resistance layer is higher than the oxygen content of the second variable resistance layer, it is required that oxidation of the first variable resistance layer adequately proceed. In the above configuration, by introducing the reactive gas with a greater amount in the step of forming the first variable resistance layer, the oxygen content of the first variable resistance layer can be more surely made higher than the oxygen content of the second variable resistance layer.

According to the manufacturing method of the non-volatile memory device according to a fifth aspect of the present invention, in the method of manufacturing the non-volatile memory device according to any one of the first to fourth aspects, the step of forming the second variable resistance layer is performed in a state in which the substrate is kept at a temperature at which the self-decomposition reaction of the source gas occurs.

In such a configuration, the oxygen content of the second variable resistance layer can be lowered easily.

According to the manufacturing method of the non-volatile memory device according to a six aspect of the present invention, in the method of manufacturing the non-volatile memory device according to any one of the first to fifth aspects, the step of forming the second variable resistance layer is performed in a state in which the substrate is kept at a temperature at which the self-decomposition reaction of the source gas does not occur and the amount of the reactive gas introduced in the step of forming the second variable resistance layer is less than the amount of the reactive gas introduced in the step of forming the first variable resistance layer.

In such a configuration, the second variable resistance layer can be formed conformally, too.

According to the manufacturing method of the non-volatile memory device according to a seventh aspect of the present invention, in the method of manufacturing the non-volatile memory device according to any one of the first to sixth aspects, the oxygen content of the first variable resistance layer is made higher than the oxygen content of the second variable resistance layer in such a manner that the first variable layer is formed in the third step included in the step of forming the first variable resistance layer by introducing the reactive gas such that a layer is deposited in a reaction-limited state of the reactive gas; and the second variable resistance layer is deposited in the third step included in the step of forming the second variable resistance layer by introducing the reactive gas such that a layer is deposited in a supply-limited state of the reactive gas.

In such a configuration, the first variable resistance layer can be more surely formed to have a substantially stoichiometric composition, while the second variable resistance layer can be more surely formed to have an oxygen-deficient composition.

The term "reaction-limited state" refers to a state in which a deposition rate is constant (invariable) without being affected by a supply amount of a raw material gas or the reactive gas. For example, the reaction-limited state is considered as a state in which, when the reaction speed is very low, the reaction speed is not affected by the supply amount of the raw material.

The term "supply-limited state" refers to a state in which a deposition rate increases according to the supply amount of the raw material gas or the reactive gas. For example, the supply-limited state is considered as a state in which, when the reaction speed is sufficiently high, the reaction speed is limited by the supply amount of the raw material.

According to the manufacturing method of the non-volatile memory device according to an eighth aspect of the present invention, the method of manufacturing the non-volatile memory device according to any one of the first to seventh aspects, comprises forming a semiconductor layer or an insulator layer on the interlayer insulating layer such that the semiconductor layer or the insulator layer covers an entire upper end surface of the second electrode and protrudes outward over the entire upper end surface; and forming a third electrode on the semiconductor layer or the insulator layer, to attain a current steering element comprising the second electrode, the semiconductor layer or the insulator layer and the third electrode.

According to the manufacturing method of the non-volatile memory device according to a ninth aspect of the present invention, the method of manufacturing the non-volatile memory device according to any one of the first to eighth aspects, the transition metal is tantalum, and when a tantalum oxide constituting the first variable resistance layer is $TaO_x$ and a tantalum oxide constituting the second variable resistance layer is $TaO_y$, $0<y<2.5$ and $x \geq y$ are satisfied, and $x \geq 2.1$ and $0.8 \leq y \leq 1.9$ are preferably satisfied.

In such a configuration, it is possible to attain a non-volatile memory element which performs a resistance changing operation stably and has a good retention characteristic.

According to another aspect of the present invention, a method of manufacturing a non-volatile memory device comprises the steps of: forming a first electrode on a substrate; forming an interlayer insulating layer on the first electrode; forming a memory cell hole in the interlayer insulating layer such that the memory cell hole penetrates the interlayer insulating layer and exposes the memory cell hole; forming a first variable resistance layer comprising a transition metal oxide inside of the memory cell hole conformally with respect to the memory cell hole; forming a second variable resistance layer in succession with formation of the first variable resistance layer within the same chamber such that the second variable resistance layer is filled on the first variable resistance layer inside of the memory cell hole, the second variable resistance layer comprising the same transition metal oxide as the transition metal oxide of the first variable resistance layer, an oxygen content of the transition metal oxide of the second variable resistance layer being lower than an oxygen content of the transition metal oxide of the first variable resistance layer; and forming the second electrode on the second variable resistance layer; wherein each of the step of forming the first variable resistance layer and the step of forming the second variable resistance layer includes performing a cycle once or plural times, the cycle consisting of a first step of introducing a source gas composed of molecules containing atoms of a transition metal; a second step of removing the source gas after the first step; a third step of introducing a reactive gas to form the transition metal oxide after the second step; and a fourth step of removing the reactive gas after the third step; wherein the step of forming the first variable resistance layer is performed in a state in which the substrate is kept at a temperature at which a self-decomposition reaction of the source gas does not occur; the step of forming the second variable resistance layer is performed in a state in which the substrate is kept at a temperature at which the self-decomposition reaction of the source gas occurs, and wherein the oxygen content of the transition metal oxide of the first variable resistance layer is made higher than the oxygen content of the transition metal oxide of the second variable resistance layer in such a manner that the first variable resistance layer is deposited in the third step included in the step of forming the first variable resistance layer by introducing the reactive gas such that a layer is deposited in a reaction-limited state of the reactive gas; and the second variable resistance layer is deposited in the third step included in the step of forming the second variable resistance layer by introducing the reactive gas such that a layer is deposited in a supply-limited state of the reactive gas.

In this manufacturing method, the first variable resistance layer may not be oxygen-deficient.

According to another aspect of the present invention, a method of manufacturing a non-volatile memory device, comprises the steps of: forming a first electrode on a substrate; forming an interlayer insulating layer on the first electrode; forming a memory cell hole in the interlayer insulating layer such that the memory cell hole penetrates the interlayer insulating layer and exposes the first electrode; forming a first variable resistance layer comprising a transition metal oxide inside of the memory cell hole conformally with respect to the memory cell hole; forming a second variable resistance layer in succession with formation of the first variable resistance layer within the same chamber such that the second variable resistance layer is filled on the first variable resistance layer inside of the memory cell hole, the second variable resistance layer comprising the same transition metal oxide as the transition metal oxide of the first variable resistance layer, an oxygen content of the transition metal oxide of the second variable resistance layer being lower than an oxygen content of the transition metal oxide of the first variable resistance layer; and forming the second electrode on the second variable resistance layer; wherein each of the step of forming the first variable resistance layer and the step of forming the second variable resistance layer includes performing a cycle once or plural times, the cycle consisting of a first step of introducing a source gas composed of molecules containing atoms of a transition metal; a second step of removing the source gas after the first step; a third step of introducing a reactive gas to form the transition metal oxide after the second step; and a fourth step of removing the reactive gas after the third step; wherein the step of forming the first variable resistance layer and the step of forming the second variable resistance layer are performed in a state in which the substrate is kept at a temperature at which a self-decomposition reaction of the source gas does not occur; the oxygen content of the transition metal oxide of the first variable resistance layer is made higher than the oxygen content of the transition metal oxide of the second variable resistance layer in such a manner that the first variable resistance layer is formed in the third step included in the step of forming the first variable resistance layer by introducing the reactive gas such that a layer is deposited in a reaction-limited state of the reactive gas; and the second variable resistance layer is formed in the third step included in the step of forming the second variable resistance layer by introducing the reactive gas such that a layer is deposited in a supply-limited state of the reactive gas.

In this manufacturing method, the first variable resistance layer may not be oxygen-deficient.

The term "conformally formed" means that a growth rate of the layer deposited on a side surface of the memory cell hole is substantially equal to a growth rate of the layer deposited on a bottom portion of the memory cell hole.

The term "filled" means that the growth rate of the layer deposited on the side surface of the memory cell hole is lower than the growth rate of the layer deposited on the bottom portion of the memory cell hole.

Hereinafter, results of experiments conducted to discover the findings of the manufacturing method of the present invention will be described.

Experiment Example 1

Relationship Between a Supply Time of a Raw Material Gas and a Growth Rate of a Variable Resistance Layer In study of forming conditions of the variable resistance layer, firstly, a relationship between a supply time of the raw material gas and a growth rate of the variable resistance layer was studied.

Figure 8:
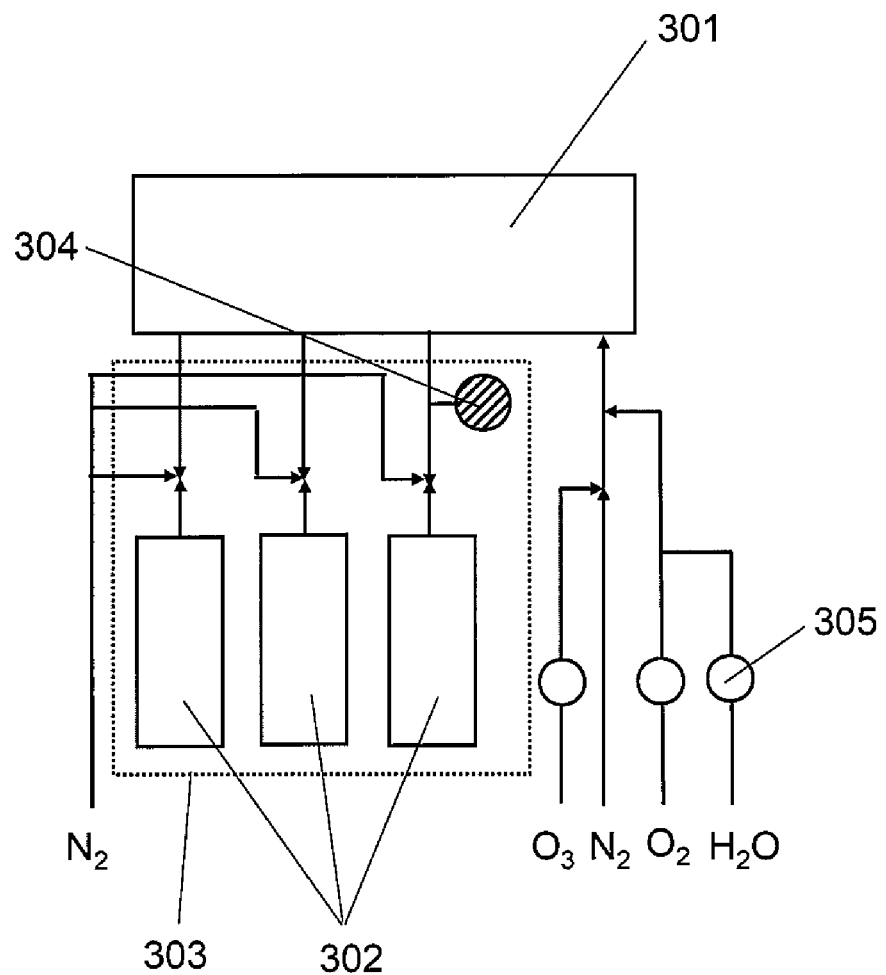
FIG. 8 is a schematic view of an apparatus used in Experiment example 1 to Experiment example 3.

FIG. 8 shows a schematic view of an apparatus (Zestone manufactured by Hitachi Kokusai Denki Co., Ltd.) used in the present Experiment example. TBTDET which was a raw material of the variable resistance layer was filled into a raw material container 302 (volume: 200 ml).

A 8-inch Si substrate heated up to 200 degrees C. was held within a chamber 301 (volume: 40 L). In advance, an interlayer insulating layer was formed on a surface of the substrate and memory cell holes were formed in an array form in the interlayer insulating layer. A raw material supply system 303 includes a heater for heating. The raw material supply system 303 includes a gas pipe of a carrier gas such as $N_2$ to introduce the raw material into a deposition chamber 301. 304 designates a vacuum indicator (gauge). 305 indicates a valve used for selecting reactive gases.

In a first step, TBTDET (liquid) within the raw material container 302 was heated up to 100 degrees C. and subjected to bubbling by using a nitrogen gas (supply flow rate: 150 sccm) which was a carrier gas. Thereby, a source gas (TBTDET gas) was introduced into the chamber 301. When a deposition process was not carried out, a pressure within the chamber was reduced by a vacuum pump. The pressure within the chamber 301 was set to 100 Pa during the deposition. In this step, the TBTDET was adsorbed onto sites on the surface of the substrate to form a mono-molecular layer. Differently from a CVD mode, a substrate temperature was low. Therefore, adsorption stopped when the sites on the surface of the substrate were saturated, and growth stopped at a time point when the mono-molecular layer was formed in a self-controlled manner. At this time, a portion of TBTDET molecules was sometimes partially decomposed and disengaged.

In a second step, an unnecessary portion of the source gas within the chamber 301 was purged using a nitrogen gas. Thereby, the source gas within the chamber 301 was replaced by the nitrogen gas.

In a third step, ozone ($O_3$) as a reactive gas was introduced (supply flow rate: 100 sccm). Thereby, the TBTDET mono-molecular layer was oxidized to form a Ta oxide layer, and ligand contained in the TBTDET was oxidized into a by-product (gas) such as $CO_2$ and removed.

In a fourth step, an unnecessary portion of the reactive gas and the by-product were purged from the chamber 301 by the nitrogen gas (supply flow rate: 150 sccm). Thereby, the ozone gas within the chamber 301 was replaced by the nitrogen gas.

By repeating a basic cycle consisting of the first to fourth steps depending on a layer thickness, a tantalum oxide layer was deposited.

In the present Experiment example, a source gas supply time changed in the first step like 0.5 sec, 1 sec, 1.5 sec, and 2.5 sec, while in the third step, a supply time of the reactive gas was constant and 10 sec in contrast to the source gas supply time so that the TBTDET mono-molecular layer adsorbed in each cycle was fully oxidized to form a Ta oxide layer ($Ta_2O_5$). And, in each of the conditions, the basic cycle was repeated 50 times.

Thicknesses of the deposited tantalum oxide layers were measured by an ellipsometer or a SEM (scanning electron microscope). With respect to the conditions of the source gas supply time, 0.5 sec, 1 sec, 1.5 sec, and 2.5 sec, the thicknesses of the tantalum oxide layers were 26 angstrom, 42.5 angstrom, 51 angstrom, and 53 angstrom, respectively. The obtained thicknesses were divided by the number of times of basic cycles to derive growth rates corresponding to each basic cycle (per basic cycle). The results were 0.52 angstrom/cycle, 0.85 angstrom/cycle, 1.02 angstrom/cycle, and 1.06 angstrom/cycle, with respect to the conditions of the source gas supply time, 0.5 sec, 1 sec, 1.5 sec, and 2.5 sec, respectively.

Figure 9A:
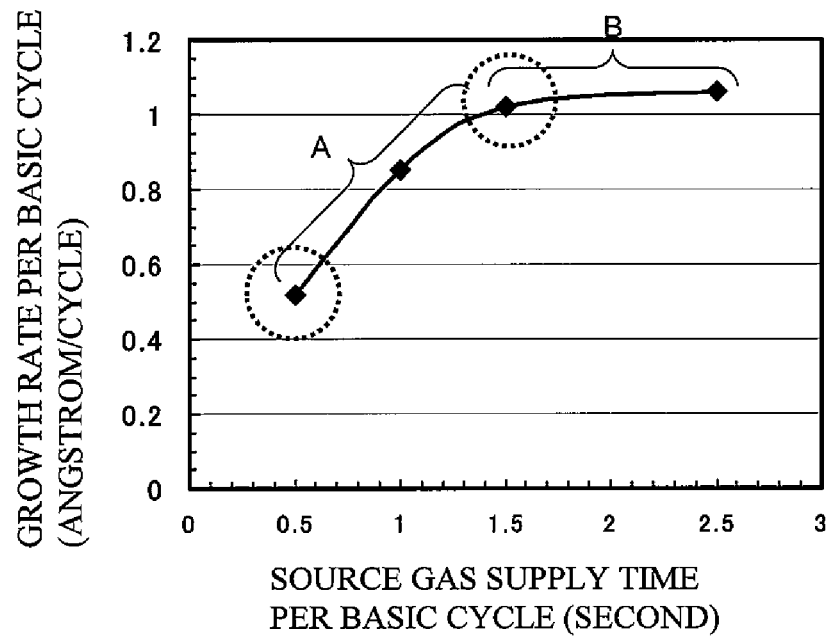
FIG. 9A is a graph showing a result of the Experiment example 1.

The above results are shown in FIG. 9A. A horizontal axis indicates the supply time of the source gas corresponding to each basic cycle (per basic cycle), while a vertical axis indicates a growth rate corresponding to each basic cycle.

Figure 9B:
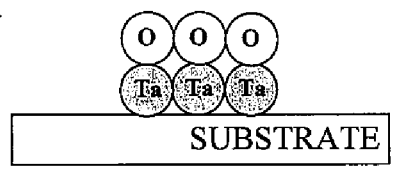
FIG. 9B is a schematic view showing a state of a substrate surface corresponding to a range A of FIG. 9A.

As can be seen from FIG. 9A, the growth rate increased with an increase in the source gas supply time until the source gas supply time reached 1.5 sec. In was considered that the growth of the tantalum oxide was in a supply-limited state. That is, it was presumed that in an experiment corresponding to a range A, the Ta oxide was adsorbed onto only a portion of the surface (state A) after the fourth step in each cycle, as shown in FIG. 9B.

Figure 9C:
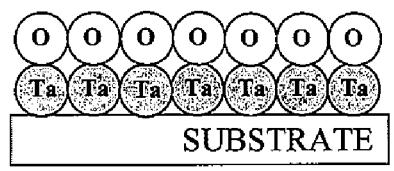
FIG. 9C is a schematic view showing a state of the substrate surface corresponding to a range B of FIG. 9A.

By comparison, as shown in FIG. 9A, the growth rate did not substantially change when the source gas supply time increased in a range of 1.5 sec or longer. In was considered that the growth of the tantalum oxide was in a reaction-limited state. That is, it was presumed that in an experiment corresponding to a range B, the Ta oxide was adsorbed onto the entire surface (state B) after the fourth step in each cycle, as shown in FIG. 9C. By depositing the variable resistance layer in the reaction-limited state, it becomes possible to deposit the variable resistance layer which is less in non-uniformity.

Figure 20:
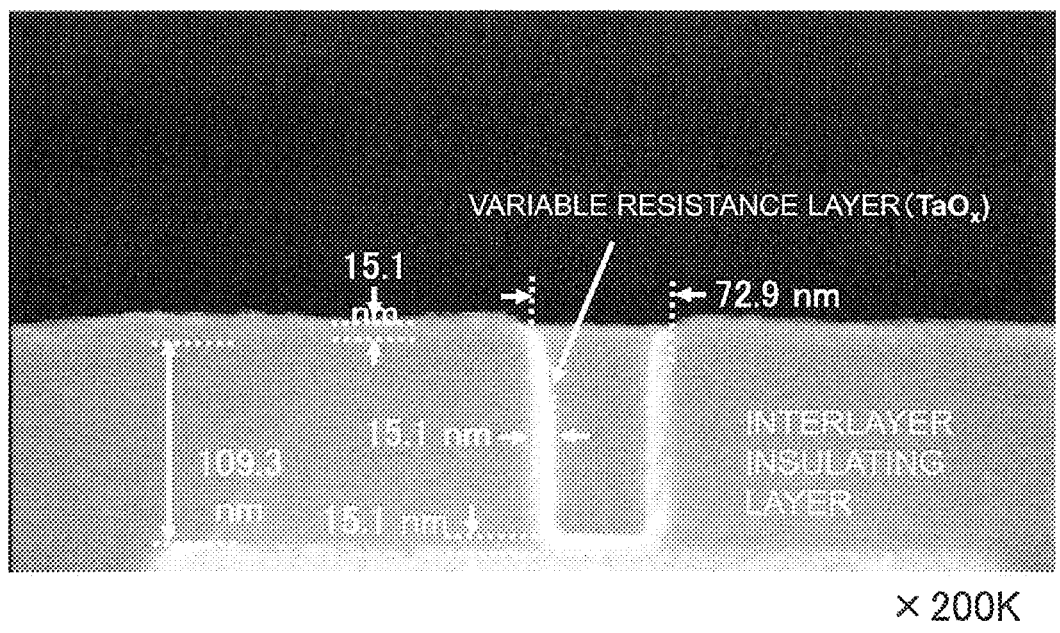
FIG. 20 is a cross-sectional SEM image of a variable resistance layer inside of a miniaturized hole which is deposited by the manufacturing method of the present invention.

FIG. 20 shows a SEM photograph of a cross-section of a memory cell hole into which the variable resistance layer ($TaO_x$) having a thickness of 15.1 nm was deposited, the memory cell hole having an opening diameter of 72.9 nm and a depth of 109.3 nm. Thicknesses of the variable resistance layer deposited on the surface of the interlayer insulating layer, a wall surface of the memory cell hole, and a bottom portion of the memory cell hole were 15.1 nm, which exhibited very good bottom coverage.

Figure 19:
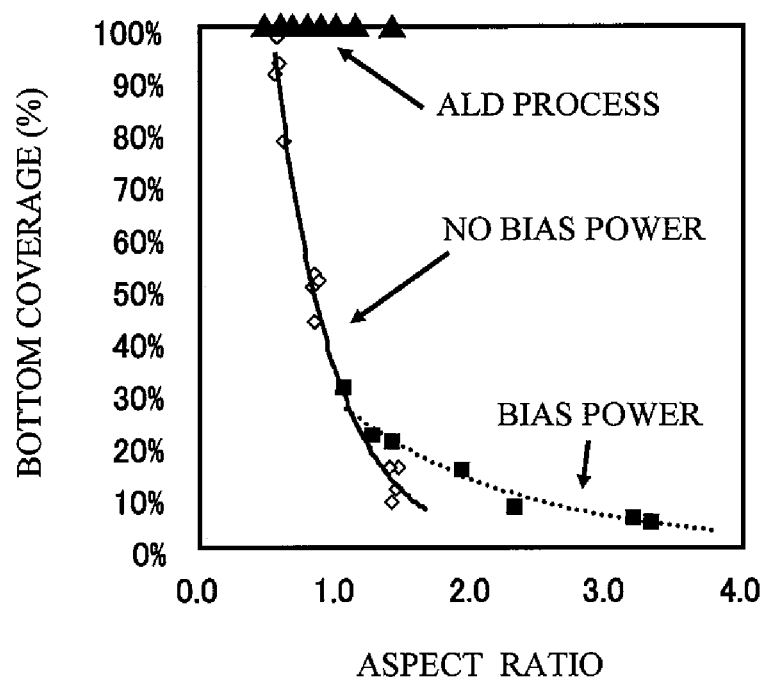
FIG. 19 is a graph showing a relationship between an aspect ratio of a memory cell hole and a bottom coverage of a variable resistance layer filled into the hole, and is a view showing a comparison between a result obtained by performing the manufacturing method of the present invention and a result obtained by performing a conventional sputtering method.

FIG. 19 shows a change in the bottom coverage in a case where the aspect ratio of the memory cell hole is changed. It can be seen that in the case of using an ALD process, the bottom coverage does not substantially change irrespective of a change in the aspect ratio. Alternatively, a side wall coverage may be used as an indicator instead of the bottom coverage.

Figure 21:
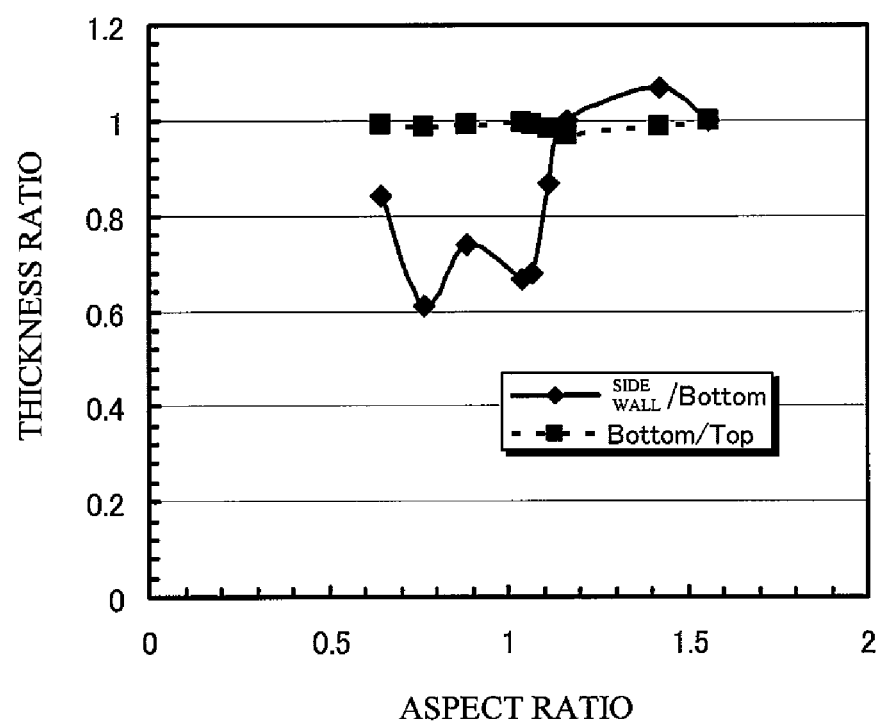
FIG. 21 is a view showing a relationship among an aspect ratio of a memory cell hole, a bottom coverage with respect to a top of the memory cell hole and a side wall coverage with respect to a bottom of the memory cell hole, in the variable resistance layer inside of a memory cell hole which is deposited by the manufacturing method of the present invention.

FIG. 21 shows a relationship between the bottom coverage and the side wall coverage. As can be seen from FIG. 21, in a range in which the aspect ratio is equal to or greater than 1, the side wall coverage is improved significantly. In a range in which the aspect ratio is greater than 1, the side wall coverage can be used as an indicator of step management.

Experiment Example 2

Relationship Between a Supply Time of a Reactive Gas and a Growth Rate of a Variable Resistance Layer In view of the result of Experiment example 1, in Experiment example 2, the reactive gas supply time was studied using the conditions in which the source gas supply time was set to 1.5 sec so that the Ta oxide was adsorbed onto the entire surface. Experiment example 2 was conducted using the same apparatus and experiment conditions as those of Experiment example 1 except that the source gas supply time was fixed as 1.5 sec and the reactive gas supply time was made different.

In the present Experiment example, in each of cases where the reactive gas supply time was set to 0 sec, 0.5 sec, 5 sec, 10 sec, and 15 sec, the basic cycle was repeated 50 times. Thicknesses of the deposited tantalum oxide layers in that case were measured by the ellipsometer. As a result, thicknesses of the tantalum oxide layers were 30.5 angstrom, 31.5 angstrom, 40.5 angstrom, 50.5 angstrom, and 50.5 angstrom, respectively. The obtained thicknesses were divided by the number of times of basic cycles to derive growth rates corresponding to each basic cycle. The results were 0.61 angstrom/cycle, 0.63 angstrom/cycle, 0.81 angstrom/cycle, 1.01 angstrom/cycle, and 1.01 angstrom/cycle.

Figure 10A:
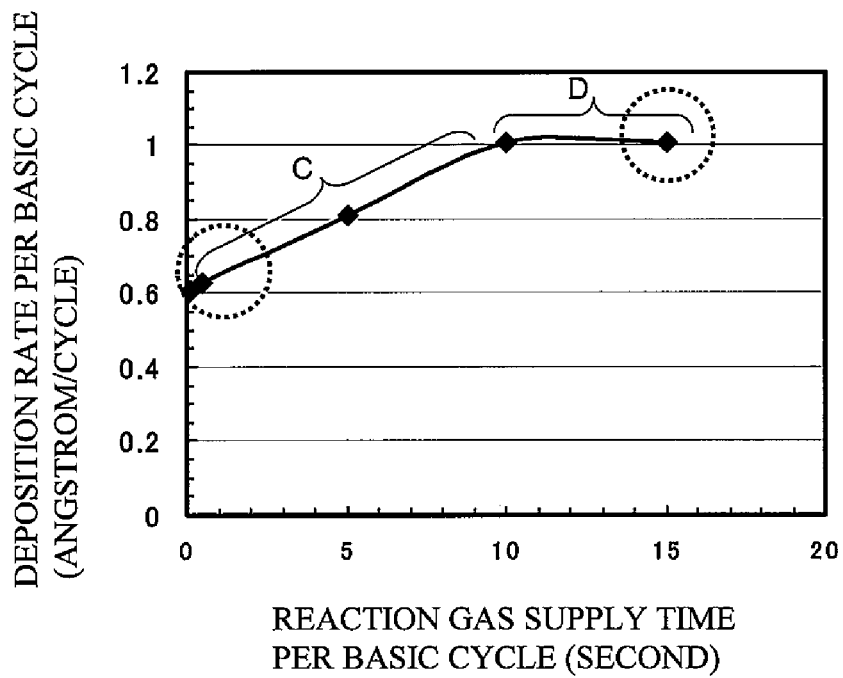
FIG. 10A is a graph showing a result of the Experiment example 2.

The above results are shown in FIG. 10A. A horizontal axis indicates a reactive gas supply time ($O_3$ pulsing time) corresponding to each basic cycle (per basic cycle), while a vertical axis indicates a deposition rate corresponding to each basic cycle.

Figure 10B:
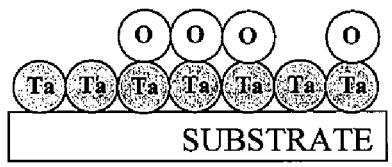
FIG. 10B is a schematic view showing a state of the substrate surface corresponding to a range C of FIG. 10A.

As can be seen from FIG. 10A, the deposition rate increased with an increase in the reactive gas supply time until the reactive gas supply time reached 10 sec. It was considered that the growth of the tantalum oxide was in the supply-limited state. That is, it was presumed that in an experiment corresponding to a range C, only a portion of the surface of the Ta layer was oxidized after the fourth step in each cycle, and a state (state C) in which oxygen was deficient with respect to a stoichiometric composition was formed, as shown in FIG. 10B.

Figure 10C:
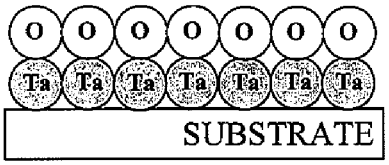
FIG. 10C is a schematic view showing a state of the substrate surface corresponding to a range D of FIG. 10A.

By comparison, as shown in FIG. 10A, the deposition rate did not substantially change when the reactive gas supply time increased in a range of 10 sec or longer. It was considered that the growth of the tantalum oxide was in the reaction-limited state. That is, it was presumed that in an experiment corresponding to a range D, the entire surface of the Ta layer was oxidized in a state close to the stoichiometric composition after the fourth step in each cycle, as shown in FIG. 10C.

A composition of the tantalum oxide layer having a thickness 10 nm obtained in the case where the reactive gas supply time was 15 sec was analyzed by XPS spectroscopy. A content ratio of the composition was Ta/O=33/67 (Ta: 33 atm %, O: 67 atm %). By comparison, a composition of the tantalum oxide layer having a thickness 10 nm obtained in the case where the reactive gas supply time was 0.5 sec was analyzed by the XPS spectroscopy, and a content ratio of the composition was Ta/O=40/60 (Ta: 40 atm %, O: 60 atm %). From this, it was found that the oxygen content in the latter example was lower.

In a normal ALD process, by setting a source gas supply time and a reactive gas supply time to adequate times, respectively, it is possible to deposit a dense layer without defectives even though the layer is very thin. However, in view of the above result of the study, it can be considered that a plurality of variable resistance layers which are different in oxygen content from each other are able to be deposited successively by controlling the reactive gas supply time.

To deposit the variable resistance layer with a higher oxygen content, it is required that the reactive gas supply time be set to fall within a range in which the growth rate is saturated, i.e., the reaction-limited state be attained, like the state D of FIG. 10A. By comparison, to deposit the variable resistance layer which is low in oxygen content and oxygen-deficient, it is required that the reactive gas supply time be set shorter than the range in which the growth rate is saturated, i.e., the supply-limited state be attained, like the state C of FIG. 10A.

Alternatively, the oxygen content may be controlled based on a supply amount (volume) of the reactive gas, a flow rate (supply rate) of the reactive gas, and the like, instead of the reactive gas supply time.

In view of the above results, for example, in Embodiment 1, the first variable resistance material layer 181a can be deposited under the conditions in which the TBTDET is heated up to 100 degrees C., the substrate is heated up to 200 degrees C., the source gas supply time in the first step in one basis cycle is set to 1.5 sec or longer, and the reactive gas supply time in the third step in one basis cycle is set to 10 sec or longer.

In Embodiment 1, the second variable resistance material layer 181b can be deposited under the conditions in which the TBTDET is heated up to 100 degrees C., the substrate is heated up to 200 degrees C., the source gas supply time in the first step in one basis cycle is set to 1.5 sec or longer, and the reactive gas supply time in the third step in one basis cycle is set to less than 10 sec.

Experiment Example 3

In Experiment example 3, a method of controlling the oxygen content of the variable resistance layer in a wider range was studied. In Experiment example 3, an experiment was conducted with the same apparatus and experiment conditions as those of the state D in Experiment example 2 except that the substrate temperature was made different.

Figure 11A:
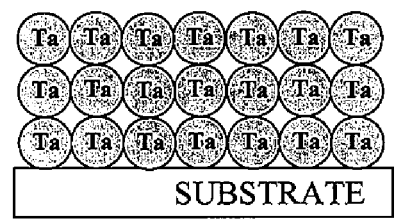
FIG. 11A is a schematic view showing a result of the Experiment example 3 and showing a state of the substrate surface after a first step.
Figure 11B:
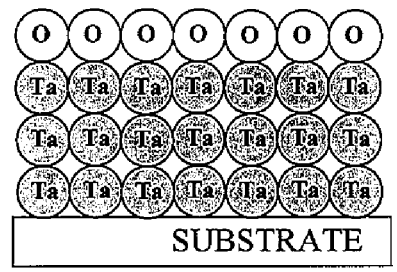
FIG. 11B is a schematic view showing a result of the Experiment example 3 and showing a state of the substrate surface after a third step.

In Experiment example 3, to deposit a variable resistance layer with a lower oxygen content, a substrate heating temperature within the reaction chamber was set to a temperature (e.g., 350 degrees C. in the case where the source gas was TBTDET) at which the self-decomposition reaction of the source gas on the substrate surface occurred. When the TBTDET gas was introduced as the source gas in the first step, the self-decomposition reaction of the source gas on the substrate surface occurred and a Ta layer composed of a plurality of Ta atomic layers was deposited thereon, as shown in FIG. 11A. Then, in the second step, a nitrogen gas was introduced into the reaction chamber to purge the source gas, and then, in the third step, ozone which was the reactive gas was introduced into the reaction chamber such that the growth of the layer was in the supply-limited state to oxidize the surface of the Ta layer composed of the plurality of Ta atomic layers (see FIG. 11B). Then, in the fourth step, the reactive gas was purged. By repeating a basic cycle consisting of the first to fourth steps, it was possible to deposit the tantalum oxide layer which was oxygen-deficient with respect to the stoichiometric composition. A composition of the tantalum oxide layer having a thickness 10 nm deposited under the above conditions was analyzed by XPS spectroscopy. A content ratio of the composition was Ta/O=62/38 (Ta: 62 atm %, O: 38 atm %). It was found that the oxygen content of the tantalum oxide layer in Experiment example 3 was lower than the oxygen content of the tantalum oxide layer deposited in the range C in Experiment example 2.

In view of the above result, the metal oxide layer with a lower oxygen content can be deposited, by setting the substrate temperature to allow the self-decomposition reaction of the source gas to occur (the variable resistance layer to be deposited in the CVD mode) in addition to reducing an amount of the introduced reactive gas (e.g., introducing the reactive gas such that the supply-limited state is attained).

That is, by depositing the second variable resistance material layer 181b by the CVD mode, it becomes easier to further lower the oxygen content of the second variable resistance material layer 181b than in the case of using the ALD mode.

Hereinafter, embodiments of the present invention will be described in conjunction with the findings obtained from the experiment results.

Embodiment 1

[Device Configuration]

Figure 1B:
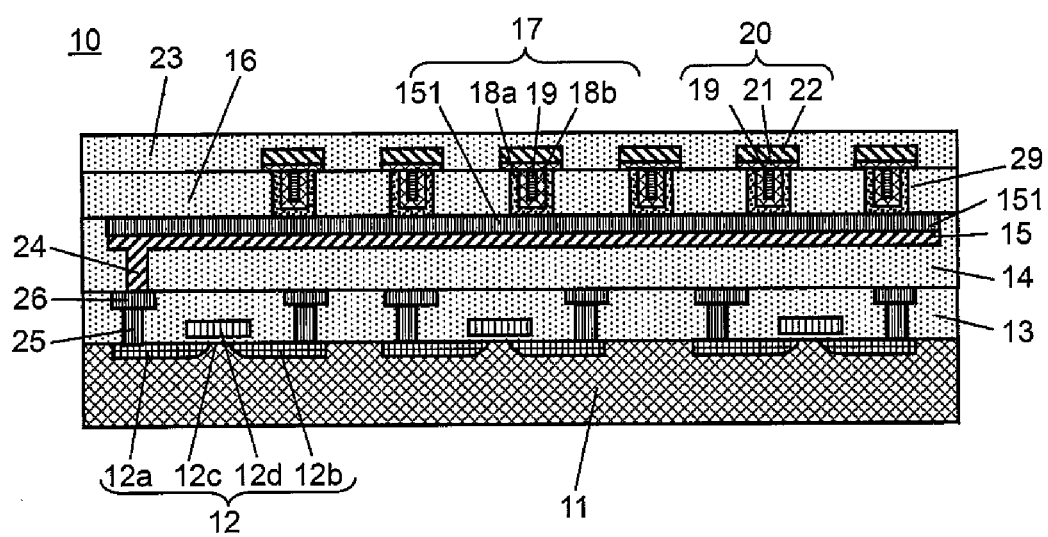
FIG. 1B is a cross-sectional view taken in the directions of arrows along 1A-1A of FIG. 1A.
Figure 2A:
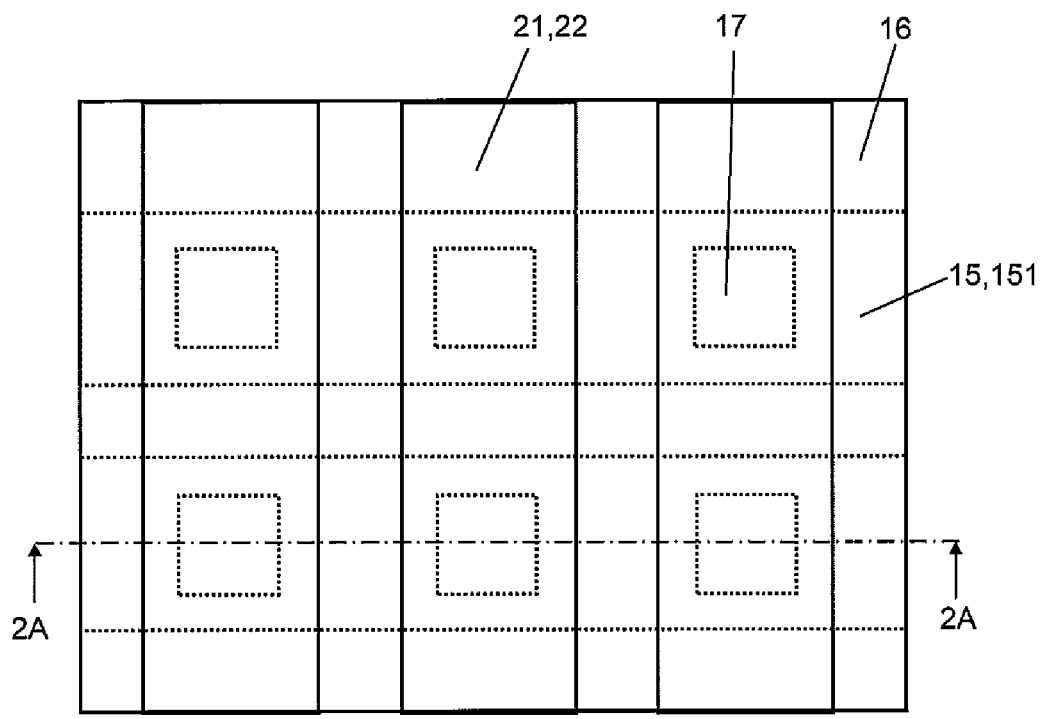
FIG. 2A is a partially enlarged plan view of a portion of major constituents of a variable resistance element 17 and of a current steering element 20 of FIG. 1.
Figure 2B:
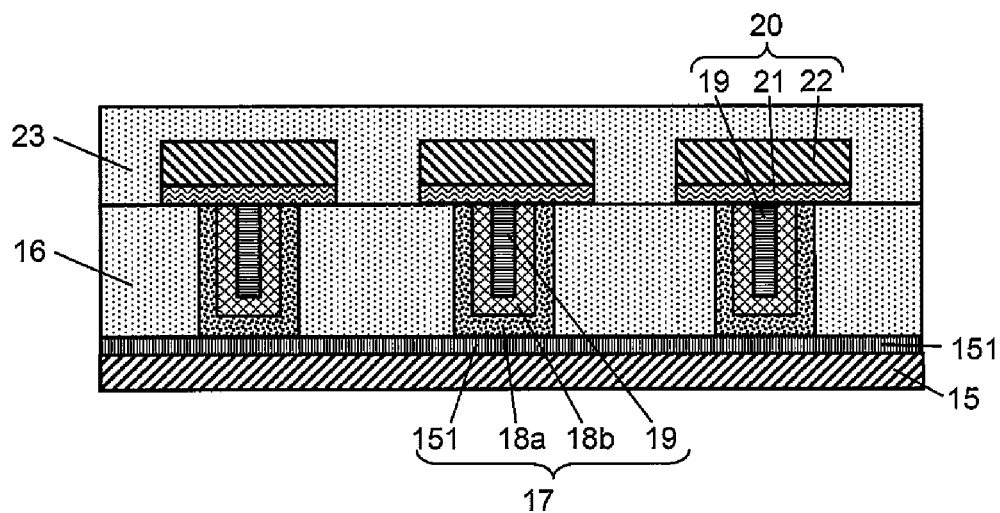
FIG. 2B is a cross-sectional view taken in the direction of arrows along 2A-2A of FIG. 2A.

FIG. 1A is a plan view showing an exemplary schematic configuration of a non-volatile memory device 10 according to Embodiment 1 of the present invention. FIG. 1B is a cross-sectional view taken in the direction of arrows along 1A-1A of FIG. 1A. FIG. 1A shows a virtual state in which a portion of an insulating protective layer 23 which is an uppermost layer is omitted for easier understanding. FIGS. 2A and 2B are partial enlarged views of major constituents of a variable resistance element 17 and a current steering element 20 having a non-ohmic property in FIGS. 1A and 1B. FIG. 2A is a plan view and FIG. 2B is a cross-sectional view taken in the direction of arrows along 2A-2A of FIG. 2A.

The non-volatile memory device 10 of the present embodiment includes a substrate 11, lower wires of a stripe shape (when viewed from a thickness direction of the substrate) each having a two-layer structure which is composed of a lower electrode backing wire 15 and a lower electrode wire 151 formed on the lower electrode backing wire 15 in physical contact with the lower electrode backing wire 15, and an interlayer insulating layer 16 formed to cover the lower wires. The interlayer insulating layer 16 is provided with memory cell holes 29 at predetermined intervals on the lower electrode wires 151. In correspondence to each of the memory cell holes 29, the variable resistance element 17 and the current steering element 20 are formed such that they are connected in series.

Inside of each of the memory cell holes 29, there are formed by the ALD mode of the present invention a first variable resistance layer 18a deposited conformally in shape to the memory cell hole 29 with a substantially equal thickness such that the first variable resistance layer 18a covers a bottom portion and a side wall of the memory cell hole 29 and is physically in contact with the lower electrode wire 151, a second variable resistance layer 18b deposited physically and electrically in contact with the first variable resistance layer 18a such that the second variable resistance layer 18b covers a bottom portion and a side wall of the first variable resistance layer 18a, and an intermediate electrode 19 deposited inward of the second variable resistance layer 18b physically in contact with the second variable resistance layer 18b. Each of variable resistance elements 17 is composed of the lower electrode wire 151 exposed in a bottom of each of the memory cell holes 29, the first variable resistance layer 18a inside of the memory cell hole 29, the second variable resistance layer 18b inside of the memory cell hole 29, and the intermediate electrode 19 inside of the memory cell hole 29.

Each of the first variable resistance layer 18a and the second variable resistance layer 18b comprises, preferably an oxygen-deficient transition metal oxide, and more preferably an oxygen-deficient tantalum oxide (TaO$_x$, 0<x<2.5). The oxygen-deficient transition metal oxide refers to an oxide in which a content ratio x of oxygen O is smaller than that in a stoichiometrically stable state (x: 2.5 in the case of tantalum) when a transition metal is M, oxygen is O, and a transition metal oxide is MO$_x$ (x is a content ratio expressed by a mole number of oxygen when transition metal is 1 mole). By using the variable resistance layer comprising the transition metal oxide of the oxygen-deficient tantalum oxide, it is possible to attain a non-volatile memory element which utilizes a resistance changing phenomenon and has a reversible and stable rewrite characteristic. This is described in detail in International Publication No. 2008/059701.

The first variable resistance layer 18a may comprise a transition metal oxide which is not substantially oxygen-deficient. When a transition metal oxide layer is formed, a little oxygen deficiency occurs even if an attempt is made to realize a stoichiometric composition which is not oxygen-deficient. The first variable resistance layer 18a may comprise the oxygen-deficient transition metal oxide (transition metal oxide which is not substantially oxygen-deficient) having a little oxygen deficiency.

In the case where the oxygen-deficient tantalum oxide is used as a material of the variable resistance layer, x≥2.1 and 0.8≤y≤1.9 are preferably satisfied, when a tantalum oxide constituting the first variable resistance layer is TaO$_x$ and a tantalum oxide constituting the second variable resistance layer is TaO$_y$. This makes it possible to attain a non-volatile memory element which performs a stable resistance changing operation and has a good retention characteristic.

Instead of the oxygen-deficient tantalum oxide, each of the first variable resistance layer 18a and the second variable resistance layer 18b may comprise an oxygen-deficient transition metal oxide such as an oxygen-deficient titanium oxide (TiO$_x$, 0<x<2.0), an oxygen-deficient hafnium oxide (HfO$_x$, 0<x<2.0), an oxygen-deficient zirconium oxide (ZrO$_x$, 0<x<2.0), an oxygen-deficient nickel oxide (NiO$_x$, 0<x<1.0), etc., which is deposited by the ALD mode (as will be described later). These transition metal oxide material exhibits a specific resistance value in response to an applied voltage or current which is equal to or greater than a threshold and holds the resistance value until a pulse voltage or pulse current which has a certain magnitude is applied newly thereto. Therefore, the transition metal oxide can be utilized in the non-volatile memory.

An oxygen content of the first variable resistance layer 18a is preferably higher than an oxygen content of the second variable resistance layer 18b. That is, when the transition metal oxide constituting the first variable resistance layer 18a is MO$_x$, and the transition metal oxide constituting the second variable resistance layer 18b is MO$_y$, x>y is preferably satisfied. A variable resistance element including a variable resistance layer composed of two tantalum oxide layers which are different in oxygen content from each other is described in detail in Patent Literature 3.

In the present embodiment, preferably, the oxygen content of the tantalum oxide constituting the first variable resistance layer 18a (higher-oxygen-concentration layer) is 68~71 atm % (atm % is percentage expressed as 100×/(1+x) in MO$_x$, hereinafter the same occurs), while the oxygen content of the tantalum oxide constituting the second variable resistance layer 18b (lower-oxygen-concentration layer) is 44~66 atm %. By setting the oxygen content in a portion of the variable resistance layer in the vicinity of the lower electrode wire 151 higher than that in another portion of the variable resistance layer, the resistance changing phenomenon caused by a redox reaction in an interface region between the lower electrode wire 151 and the variable resistance layer easily takes place. Thus, a good memory cell characteristic which enables low-voltage drive is attainable.

The lower electrode wire 151 suitably comprise a precious metal such as platinum (Pt), iridium (Ir) and the like. A standard electrode potential of the precious metal is higher than those of another metals. A standard electrode potential of Pt or Ir is +1.2 eV. By comparison, a standard electrode potential of tantalum (Ta) constituting the variable resistance layer is −0.6V. Typically, the standard electrode potential indicates a degree with which the corresponding material is oxidized less easily. When a value of the standard electrode potential is greater, the corresponding material is oxidized less easily, while when the value of the standard electrode potential is smaller, the corresponding material is oxidized more easily. According to present inventors' study, it was revealed that resistance change takes place more easily when a difference between a standard electrode potential of the material constituting the electrode and a standard electrode potential of the transition metal included in the variable resistance layer is greater, and takes place less easily when the difference is smaller. From this fact, it is estimated that easiness of oxidation of a material of an electrode and of a material of a variable resistance layer plays an important role in a mechanism of a resistance changing phenomenon. A standard electrode potential of tantalum is −0.6 eV and is lower than the standard electrode potential of platinum and the standard electrode potential of iridium. Therefore, in the above stated suitable configuration, a redox reaction occurs and migration of oxygen occurs, in a portion of the first variable resistance layer 18a which is in the vicinity of an interface between the lower electrode wire 151 comprising platinum or iridium and the first variable resistance layer 18a comprising tantalum oxide, which allows the resistance changing phenomenon to take place.

The lower electrode backing wire 15 may comprise, for example, TiAlN, Cu, Al, TiAl, or a stacked-layer structure of these. The lower electrode wire 151 may comprise Pt or Ir. The lower electrode backing wire 15 and the lower electrode wire 151 can be easily formed by depositing layers by sputtering and performing an exposure process and an etching process.

The intermediate electrode 19 preferably comprise a nitride of a transition metal constituting the variable resistance layer 18 (composed of the first variable resistance layer 18a and the second variable resistance layer 18b). When the variable resistance layer 18 comprises a tantalum oxide, the intermediate electrode 19 preferably comprises a tantalum nitride (TaN). The intermediate electrode 19 may comprise aluminum.

After depositing layers, a portion of the first variable resistance layer 18a, a portion of the second variable resistance layer 18b, and a portion of the intermediate electrode 19 which are on the interlayer insulating layer 16 are removed, thereby leaving the first variable resistance layer 18a, the second variable resistance layer 18b, and the intermediate electrode 19 filled only inside of the memory cell hole 19.

In an upper opening of each of the memory cell holes 29, the first variable resistance layer 18a, the second variable resistance layer 18b, and the intermediate electrode 19 are exposed. Each of the current steering layers 21 comprising a semiconductor or an insulator is formed to cover the first variable resistance layer 18a, the second variable resistance layer 18b, and the intermediate electrode 19 which are exposed in the upper opening of the memory cell hole 29. Each of upper electrode wires 22 is formed on the current steering layer 21 such that the upper electrode wire 22 physically and electrically contacts the current steering layer 21. The current steering layers 21 and the upper electrode wires 22 are formed on the interlayer insulating layer 16 such that they have a stripe shape so as to cross the corresponding lower electrode backing wires 15, have a greater shape (area) than the openings the memory cell holes 29 so as to cover the entire openings of the memory cell holes 29, and protrude outward over peripheries of the entire openings, respectively, when viewed from the thickness direction of the substrate. The upper electrode wire 22 constitutes a portion of the upper electrode wire. Each of the current steering elements 20 comprises the intermediate electrode 19 filled inside of each of the memory cell holes 29, a portion of the current steering layer 21 which covers the opening of the memory cell hole 29, and the corresponding upper electrode wire 22. When the current steering layer 21 is the insulator, the current steering element 20 is a MIM diode, while when the current steering layer 21 is the semiconductor, the current steering element 20 is a MSM diode.

As a material of the upper electrode wire 22, tantalum (Ta), tungsten (W), aluminum (Al), a combination of these, or a high-melting-point metal nitride such as a tantalum nitride, may be used. Although Ti or Cr may be used as a material for a portion of the upper electrode wire 22 which physically and electrically contacts the current steering layer 21, a wire resistance would increase in that case. Therefore, it is desirable to stack a layer comprising a low resistance material such as Al or Cu on a layer comprising Ti or Cr.

In a case where the insulator is used as the material of the current steering layer 21, a silicon nitride ($Si_3N_4$) may be used. In a case where the semiconductor is used as the material of the current steering layer 21, a nitrogen-deficient silicon nitride ($SiN_z$, $0 < z \leq 0.85$) may be used.

The nitrogen-deficient silicon nitride layer may be deposited by, for example, a method of sputtering a multi-crystal silicon target under an atmosphere of a mixture gas of argon and nitrogen, i.e., so-called reactive sputtering, may be used. Typical deposition conditions may be such that a pressure is 0.08~2 Pa, a substrate temperature is 20~300 degrees C., a flow ratio of a nitrogen gas (ratio of a flow rate of nitrogen to a total flow rate of argon and nitrogen) is 0~40%, and a DC power is 100~1300 W, and under these conditions, a deposition time may be adjusted such that a thickness of the silicon nitride layer becomes 5~20 nm.

In a case where the tantalum nitride is used as the electrode of the current steering element, a work function of the tantalum nitride is 4.6 eV. Since this is sufficiently higher than 3.8 eV which is an electron affinity of silicon, a Schottky barrier is formed at an interface between the current steering layer 21 and the upper electrode wire 22. When each of the upper electrode wire 22 and the intermediate electrode 19 comprises the tantalum nitride, the current steering element 20 serves as a bidirectional MIM diode or a bidirectional MSM diode depending on a nitrogen concentration of the current steering layer 21.

Alternatively, the oxygen content of the first variable resistance layer 18a may be lower than the oxygen content of the second variable resistance layer 18b. In this case, an electrode filled inward of the second variable resistance layer 18b becomes an upper electrode, and the upper electrode preferably comprises platinum, iridium and the like.

The current steering element may be formed below the memory cell hole. In this case, the electrode which physically contacts the first variable resistance layer 18a becomes the intermediate electrode. The current steering layer is formed below the intermediate electrode, and the lower electrode is formed below the current steering layer.

As shown in FIG. 1, each of the upper electrode wires 22 is extended to outside of a region (matrix region) in which the variable resistance elements 17 and the current steering elements 20 are formed in matrix. Within the matrix region, each of the upper electrode wires 22 serves as a wire (word line or bit line) connecting the memory cells to each other.

In the present embodiment, a silicon mono-crystal substrate is used as the substrate 11. On the substrate 11, there is provided a semiconductor circuit in which active elements 12 such as transistors are integrated. In FIG. 1B, each of the active elements 12 is a transistor (MOSFET) composed of a source region 12a, a drain region 12b, a gate insulating layer 12c, and a gate electrode 12d. Note that elements typically required for a memory circuit can be formed on the substrate 11 in addition to the active elements 12.

The lower electrode backing wires 15 and the upper electrode wires 22 are connected to the active elements 12, respectively, outside of the matrix region in which the variable resistance elements 17 and the current steering elements 20 are formed in matrix when viewed from the thickness direction of the substrate 11. Specifically, in the configuration of FIG. 1B, the lower electrode backing wire 15 is connected to the source region 12a of the active element 12 via a vertical contact or via 24 formed inside of a contact hole formed in the interlayer insulating layer 14, a vertical contact or via 25 formed inside of a contact hole formed in the interlayer insulating layer 13, and a semiconductor circuit wire 26. The upper electrode wire 22 is connected to another active element (not shown) in the same manner via a vertical contact or via 28.

As the interlayer insulating layers 13, 14, and 16 and the insulating protective layer 23, an insulating oxide material may be used. To be specific, a silicon oxide (SiO) deposited by the CVD process, or a TEOS-SiO layer deposited using ozone ($O_3$) and tetraethoxysilane (TEOS) by the CVD process, or a silicon nitride (SiN) layer may be used. The interlayer insulating layers 13 and 14 are preferably formed using a fluorine-containing oxide (e.g., SiOF), a carbon-containing nitride (e.g., SiCN), or an organic resin material (e.g., polyimide), to reduce a parasitic capacitance between wires. As the interlayer insulating layer 16, silicon carbon nitride (SiCN) layer or silicon oxycarbite (SiOC) layer and fluorine-doped silicon oxide (SiOF) layer, etc., which are low-dielectric constant materials, may be used.

The semiconductor circuit wire 26 may be formed using aluminum like a conventional example, but may be preferably formed using copper which can realize low resistance even in a miniaturized structure.

Figure 3:
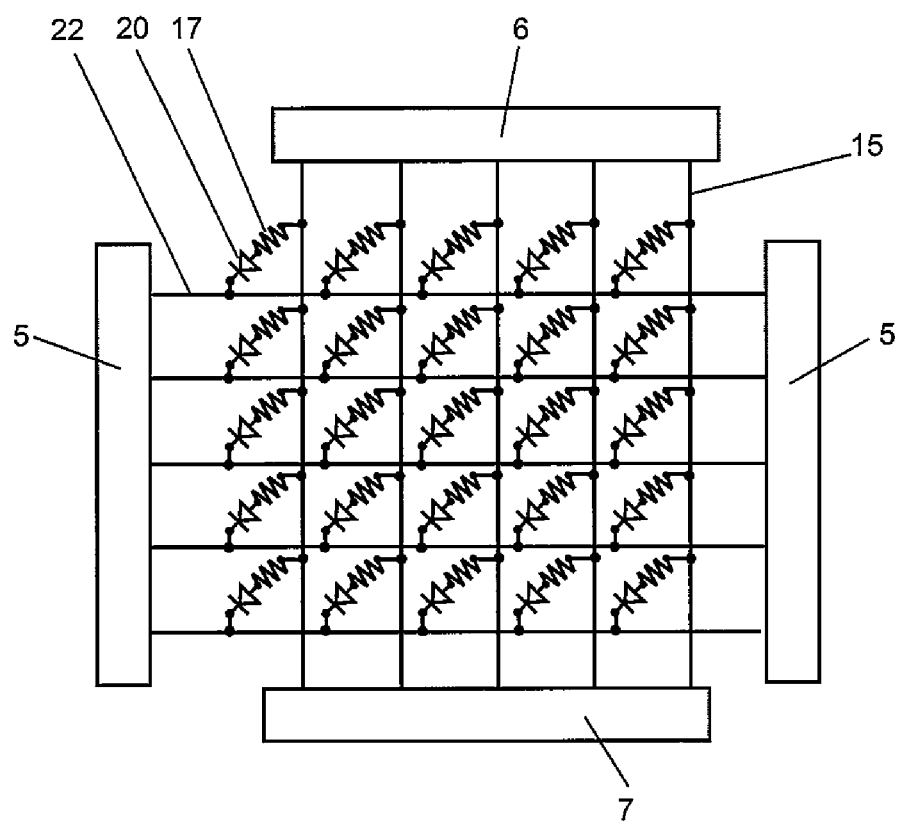
FIG. 3 is a view showing an exemplary schematic circuit configuration of the non-volatile memory device 10 according to Embodiment 1 of the present invention.

FIG. 3 is a view showing an exemplary schematic circuit configuration of the non-volatile memory device 10 according to Embodiment 1 of the present invention. As shown in FIG. 3, the variable resistance element 17 and the current steering element 20 are connected in series, one end of the variable resistance element 17 is connected to the lower electrode backing wire 15, and one end of the current steering element 20 is connected to the upper electrode wire 22. The lower electrode backing wires 15 are connected to a bit line decoder 6 and to a read circuit 7. The upper electrode wires 22 are connected to a word line decoder 5. Thus, the lower electrode backing wires 15 become the bit lines, while the upper electrode wires 22 become the word lines. At cross points at which the bit lines intersect the word lines, respectively, memory cells each including the variable resistance element 17 and the current steering element 20 connected in series are arranged in matrix. Peripheral circuits are composed of the bit line decoder 6, the word line decoder 5, and the read circuit 7. The peripheral circuits includes, for example, the active elements 12 such as MOSFETs.

In the present embodiment, as shown in FIG. 1B, the intermediate electrode 19 is entirely filled inside of each of the memory cell holes 29 (underside of the upper opening), and its upper surface can be planarized. In a case where the current steering layer 21 is formed on the planarized surface, a thin layer which is dense and has no discontinuity can be attained, which can appropriately ensure a voltage resistance of the current steering layer 21 (characteristic in which insulation breakdown will not occur even when a relatively high voltage is applied).

Since the entire upper end surface of the intermediate electrode 19 is covered with the current steering layer 21, it is possible to prevent the intermediate electrode 19 and the upper electrode wire 22 from contacting each other in an outer peripheral region of the current steering layer 21, which would otherwise cause a leak current.

Since the upper electrode wire 22 extends outward relative to an outer periphery of the intermediate electrode 19 when viewed from a thickness direction, a path of a current flowing through the current steering element 20 extends outward relative to the outer periphery of the intermediate electrode 19 when viewed from the thickness direction. In this case, an electric force line generated by an electric field extends horizontally from the intermediate electrode 19 inside of the memory cell hole 29 toward the current steering layer 21. Therefore, an effective area of the current steering element 20 (MIM diode or MSM diode) is greater than an effective area of a conventional current steering element whose layers are all filled inside of a memory cell hole. As a result, it is possible to attain the current steering element 20 which comprises the MIM diode or the MSM diode, and has a greater current capacity and less non-uniformity in characteristic, than the conventional current steering layer.

Although in the present embodiment, description has been given of the case where $SiN_z$ is used as the current steering layer 21, the present invention is not limited to this. For example, as the current steering layer 21, tantalum oxide (TaO), alumina (AlO), or titania (TiO) may be used. In the case of using TaO, for example, after depositing a Ta layer, a $TaO_z$ layer may be directly formed by dry thermal oxidation, wet thermal oxidation, plasma oxidation, or reactive sputtering, or TaO may be deposited by the ALD method, etc.

[Manufacturing Method]

Figure 4A:
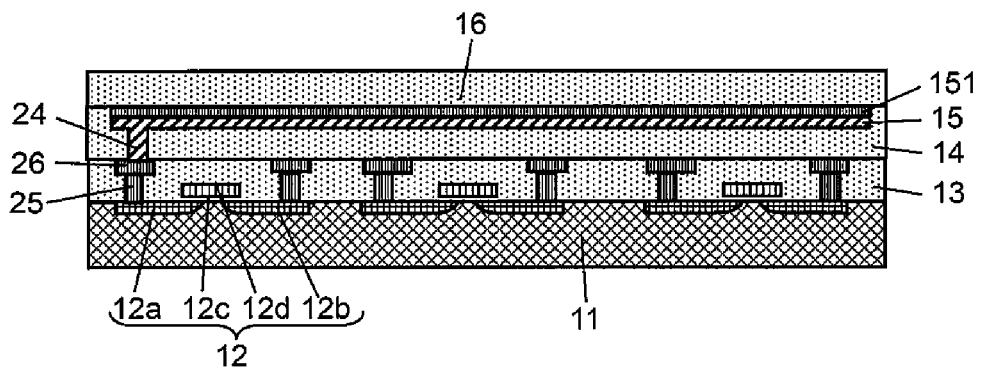
FIG. 4A is a view showing steps of a manufacturing method of the non-volatile memory device according to Embodiment 1 of the present invention, and is a cross-sectional view after steps of forming an interlayer insulating layer 14, lower electrode backing wires 15, lower electrode wires 151 and an interlayer insulating layer 16 on a substrate 11 provided with active elements 12.
Figure 4B:
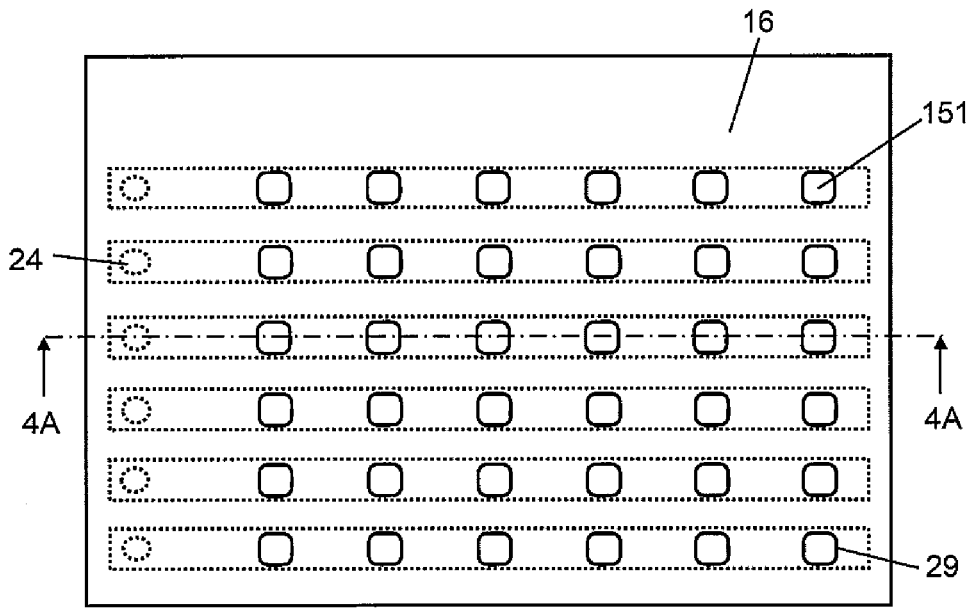
FIG. 4B is a view showing steps of the manufacturing method of the non-volatile memory device according to Embodiment 1 of the present invention, and is a plan view after a step of forming memory cell holes 29 in the interlayer insulating layer 16.
Figure 4C:
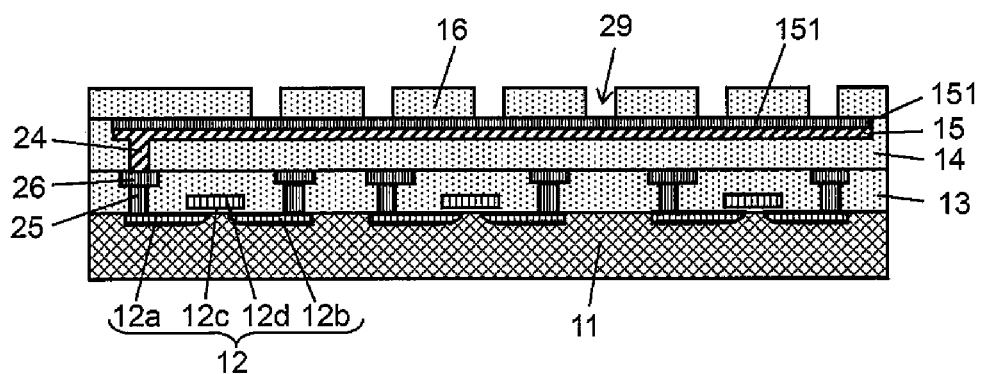
FIG. 4C is a cross-sectional view taken in the direction of arrows along 4A-4A of FIG. 4B.

FIGS. 4A to 4C are views showing steps of a manufacturing method of the non-volatile memory device according to Embodiment 1 of the present invention. FIG. 4A is a cross-sectional view after steps of forming the interlayer insulating layer 14, the vertical contacts or vias 24, the lower electrode backing wires 15, the lower electrode wires 151 and the interlayer insulating layer 16 on the substrate 11 provided with the active elements 12. FIG. 4B is a plan view after a step of forming the memory cell holes 29 in the interlayer insulating layer 16. FIG. 4C is a cross-sectional view taken in the direction of arrows along 4A-4A of FIG. 4B. Note that the cross-sectional views shown in FIGS. 4 to 7 are cross-sectional views taken in the direction of the arrows along 4A-4A in the respective steps.

Figure 5A:
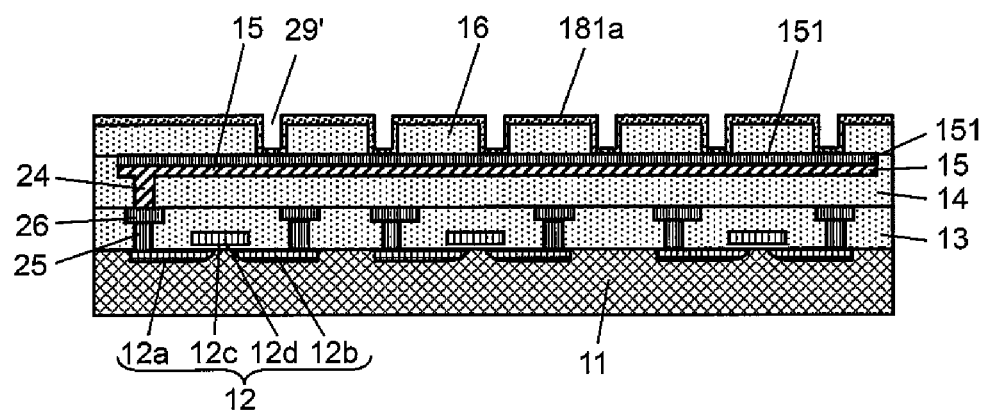
FIG. 5A is a view showing steps of the manufacturing method of the non-volatile memory device according to Embodiment 1 of the present invention, and is a cross-sectional view after a step of forming a first variable resistance material layer 181a which will become first variable resistance layers 18a on the interlayer insulating layer 16 and inside of each of the memory cell holes 29.
Figure 5B:
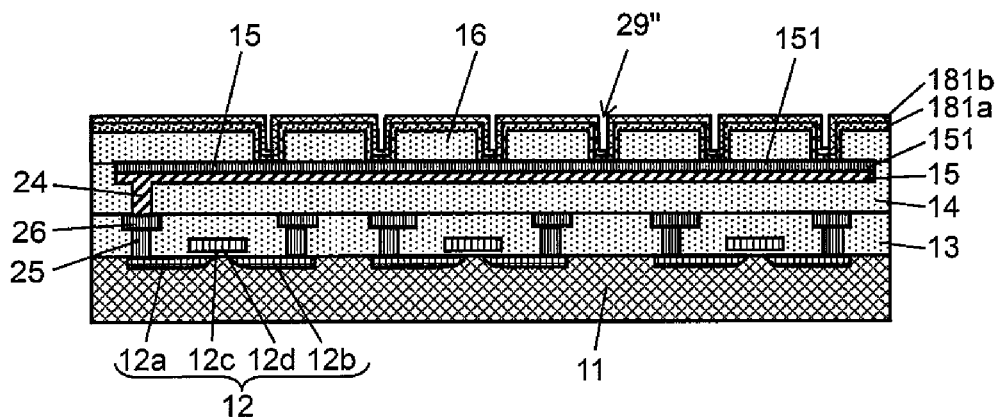
Figure 5C:
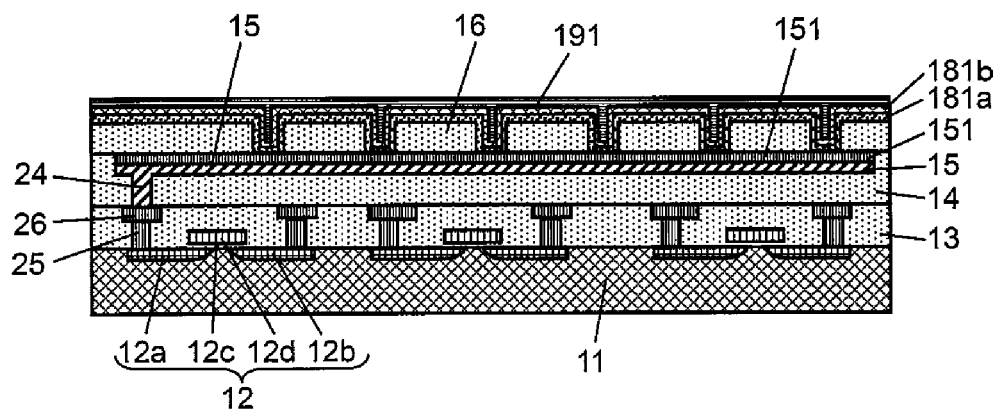
FIG. 5C is a view showing steps of the manufacturing method of the non-volatile memory device according to Embodiment 1 of the present invention, and is a cross-sectional view after a step of forming an intermediate electrode material layer 191 which will become intermediate electrodes 19 on the second variable resistance material layer 181b.

FIGS. 5A to 5C are views showing steps of the manufacturing method of the non-volatile memory device according to Embodiment 1 of the present invention. FIG. 5A is a cross-sectional view after a step of forming the first variable resistance material layer 181a which will become the first variable resistance layers 18a on the interlayer insulating layer 16 and inside of each of the memory cell holes 29. FIG. 5B is a cross-sectional view after a step of forming the second variable resistance material layer 181b which will become the second variable resistance layer 18b on the first variable resistance material layer 181a. FIG. 5C is a cross-sectional view after a step of forming an intermediate electrode material layer 191 which will become the intermediate electrodes 19 on the second variable resistance material layer 181b.

Figure 6A:
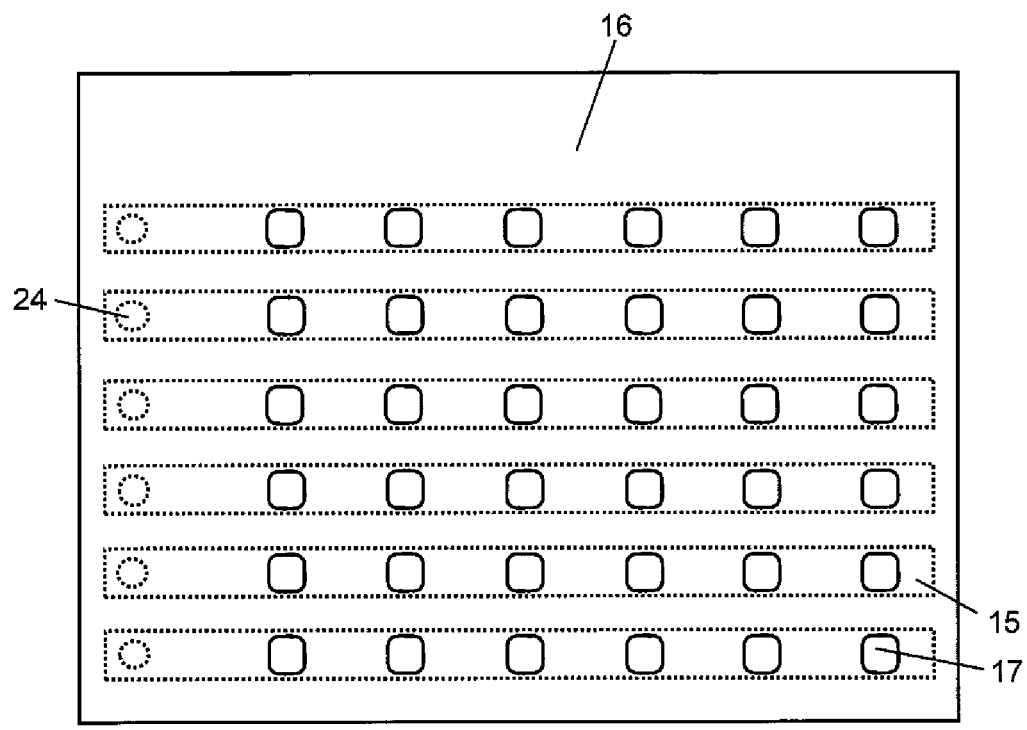
FIG. 6A is a view showing steps of the manufacturing method of the non-volatile memory device according to Embodiment 1 of the present invention, and is a plan view after a step of leaving a portion of the first variable resistance material layer 181a, a portion of the second variable resistance material layer 181b, and a portion of the intermediate electrode material layer 191, which are filled inside of each of the memory cell holes 29, and removing by CMP, a portion of the first variable resistance material layer 181a, a portion of the second variable resistance material layer 181b, and a portion of the intermediate electrode material layer 191, which are other than the portions filled inside of each of the memory cell holes 29.
Figure 6B:
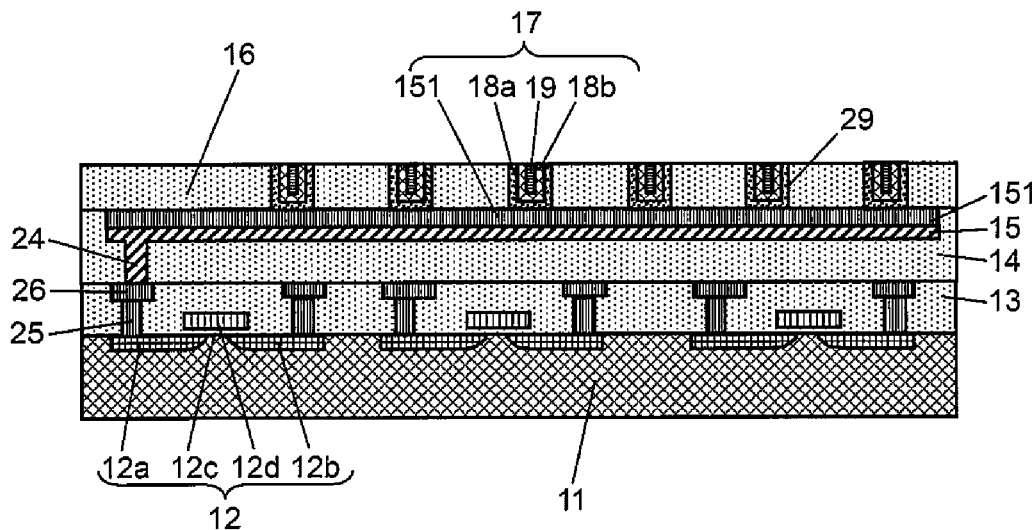
FIG. 6B is a cross-sectional view of FIG. 6A.

FIGS. 6A and 6B are views showing steps of the manufacturing method of the non-volatile memory device according to Embodiment 1 of the present invention. FIG. 6A is a plan view after steps of leaving a portion of the first variable resistance material layer 181a, a portion of the second variable resistance material layer 181b, and a portion of the intermediate electrode material layer 191 which are filled inside of each of the memory cell holes 29, and removing by CMP, a portion of the first variable resistance material layer 181a, a portion of the second variable resistance material layer 181b, and a portion of the intermediate electrode material layer 191, which are other than the portions filled inside of each of the memory cell holes 29. FIG. 6B is a cross-sectional view of FIG. 6A.

Figure 7A:
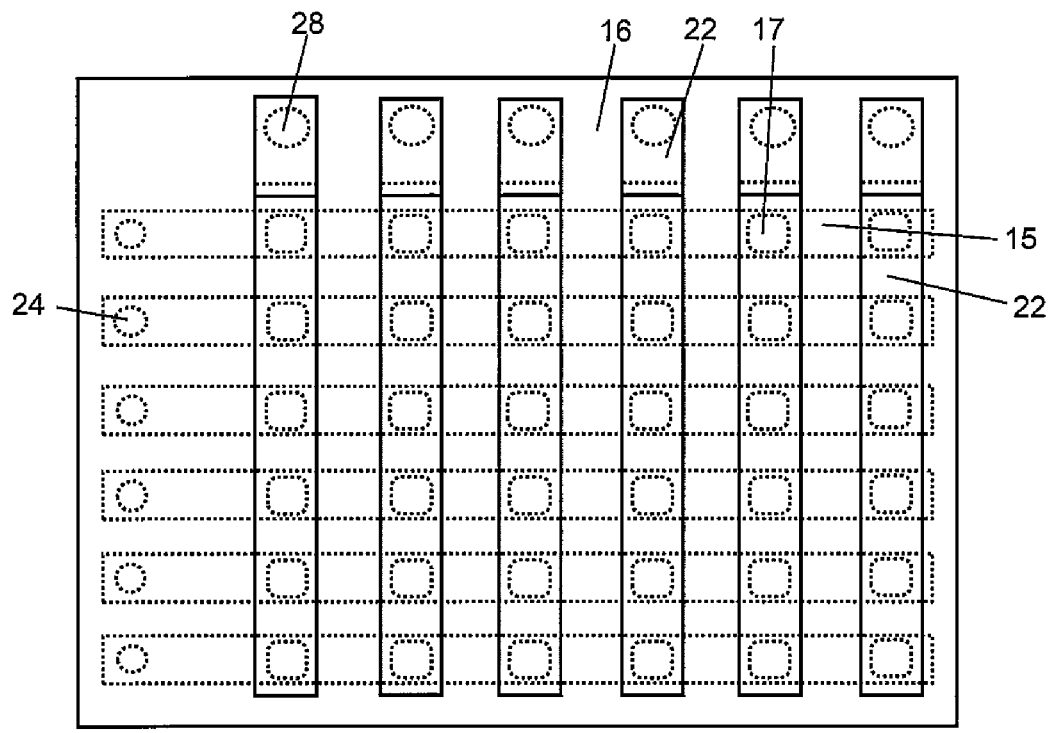
FIG. 7A is a view showing steps of the manufacturing method of the non-volatile memory device according to Embodiment 1 of the present invention, and is a plan view after steps of stacking a current steering layer 21 and an upper electrode wire 22 in this order such that the current steering layer 21 and the upper electrode wire 22 cover an entire upper opening of each of the memory cell holes 29 and protrudes outward over the entire upper opening
Figure 7B:
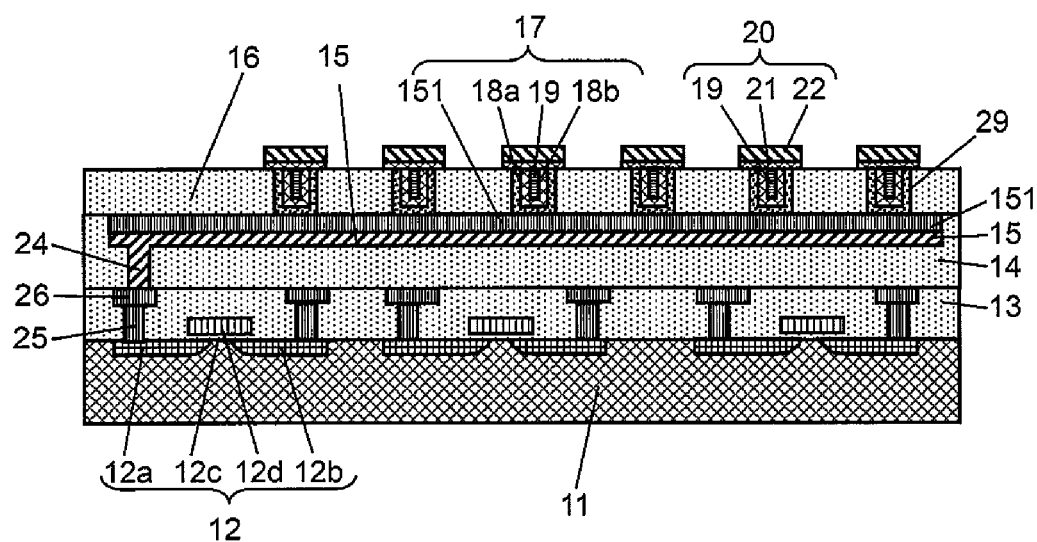
FIG. 7B is a cross-sectional view of FIG. 7A.

FIGS. 7A and 7B are views showing steps of the manufacturing method of the non-volatile memory device according to Embodiment 1 of the present invention. FIG. 7A is a plan view after steps of stacking the current steering layer 21 and the upper electrode wire 22 in this order such that the current steering layer 21 and the upper electrode wire 22 covers the entire upper opening of each of the memory cell holes 29 and protrudes outward over the entire upper opening. FIG. 7B is a cross-sectional view of FIG. 7A.

Hereinafter, the manufacturing method of the non-volatile memory device 10 of the present embodiment will be described with reference to FIGS. 4A to 7B.

Initially, as shown in FIG. 4A, on the substrate 11, the plurality of active elements 12, the interlayer insulating layers 13 and 14, the vertical contacts or vias 24 and 25, the semiconductor circuit wires 26, the lower electrode backing wires 15, the lower electrode wires 151 and the interlayer insulating layer 16 are formed.

Each of the lower electrode backing wires 15 and each of the lower electrode wires 151 are embedded in the interlayer insulating layer 14. This structure is formed in the following way. By using a technique used in a general semiconductor process step, channels of a stripe shape (when viewed from the thickness direction of the substrate) into which the lower electrode backing wires 15 and the lower electrode wires 151 are filled and contact holes connected to the semiconductor circuit wires 26 are formed in the interlayer insulating layer 14. After forming the channels and the contact holes, electric conductors which will become the lower electrode backing wires 15 and the lower electrode wires 151 are filled into them by plating, CVD, and the like, and then, unnecessary portions are removed by, for example, CMP.

Well-known manufacturing process steps can be used as the other steps to form the structure shown in FIG. 4A, and therefore detailed description thereof will not be given.

Then, as shown in FIGS. 4B and 4C, the memory cell holes 29 are formed at specified arrangement pitches in the interlayer insulating layer 16 covering the lower electrode wires 151 such that the lower electrode wires 151 are exposed in bottom portions thereof, respectively. As can be seen from FIG. 4B, the memory cell holes 29 have a smaller outer shape than a width of the lower electrode backing wires 15. Although the memory cell holes 29 have a rectangular shape as shown in FIG. 4B, they may have a circular shape, an oval shape or another shape. The memory cell holes 29 can be formed by general semiconductor process steps (lithography step and dry etching step), which will not be described specifically.

Then, as shown in FIG. 5A, on the interlayer insulating layer 16 provided with the memory cell holes 29, the first variable resistance material layer 181a (first deposited layer) which will become the first variable resistance layers 18a is formed. In the present embodiment, tantalum oxide is deposited by the ALD mode into insides (side walls and bottom portions) of the memory cell holes 29 and on the interlayer insulating layer 16, thereby forming the first variable resistance material layer 181a. In the present embodiment, the ALD mode is defined as a mode in which the layer is deposited on the substrate at a temperature at which the self-decomposition reaction of the source gas containing atoms of transition metal (in the present embodiment, tantalum) does not occur.

In the present embodiment, the first variable resistance material layer 181a is formed by the ALD mode. Specifically, for example, this forming method of the first variable resistance material layer 181a includes performing a cycle once or plural times, a cycle consisting of a first step of introducing the source gas containing atoms of the transition metal, a second step of removing the source gas after the first step, a third step of introducing the reactive gas after the second step, and a fourth step of removing the reactive gas after the third step. The ALD mode can deposit mono-molecular layers one by one. To form the first variable resistance material layer 181a having a predetermined thickness, the cycle may be repeated plural times. In the step of forming the first variable resistance material layer 181a, the substrate is kept at a temperature at which the self-decomposition reaction of the source gas does not occur. This makes it possible to carry out deposition in the ALD mode, and the first variable resistance material layer 181a is deposited conformally with a substantially even thickness insides (side walls and bottom portions) of the memory cell holes 29.

As the source gas, for example, the TBTDET may be used. A chemical formula of the TBTDET is represented by a chemical formula 1:

[Chemical formula 1]

As the reactive gas, for example, an ozone ($O_3$) gas is used.

The source gas and the reactive gas may be removed by purging using a purge gas. As the purge gas used in the purging, a gas which has a low reactivity, such as a nitrogen ($N_2$) gas is used. However, the kind of the gas is not limited to this. In a case where the purge gas is not used, the reaction chamber may be left in a vacuum state to remove the source gas and the reactive gas.

FIG. 8 shows a schematic construction of an apparatus for depositing the first variable resistance material layer 181a. The TBTDET which is the raw material (precursor) of the variable resistance layer is filled in the raw material container 302. The substrate heated up to a temperature (e.g., 200 degrees C.) at which the self-decomposition reaction of the source gas does not occur is held within the chamber 301. In this state, an interior of the chamber 301 is kept in a pressure-reduced state (in the present embodiment, 100 Pa).

In the first step, the TBTDET within the raw material container 302 is heated up to 100 degrees C., and the heated TBTDET is subjected to bubbling with the nitrogen gas which is the carrier gas, thereby generating the source gas. The source gas is introduced into the chamber 301. In this step, the molecules of the TBTDET are partially decomposed and adsorbed onto sites on the surface of the substrate, thereby forming the mono-molecular layer of the TBTDET thereon. Unlike the CVD mode in which the layer is deposited at the temperature at which the self-decomposition reaction of the source gas occurs, the substrate temperature is low and the self-decomposition reaction of the source gas does not occur. Therefore, at a time point when the sites have been saturated, the reaction stops, and the growth stops in a self-controlled manner in a state in which the mono-molecular layer has been deposited.

In the second step, the nitrogen gas is introduced into the chamber 301 to purge an unnecessary portion of the source gas from the chamber 301 and the pressure-reduced state (in this step, 100 Pa) is formed within the chamber 301.

In the third step, ozone ($O_3$) is introduced as the reactive gas into the chamber 301. Thereby, the TBTDET mono-molecular layer is oxidized to form a Ta oxide layer, and ligand contained in the TBTDET is oxidized into a by-product such as $CO_2$ and removed.

In the fourth step, the nitrogen gas is introduced into the chamber 301 to purge an unnecessary portion of the reactive gas and the by-product from the chamber 301.

By repeating plural times a basic cycle in which the first step, the second step, the third step and the fourth step are carried out sequentially in this order, the first variable resistance material layer 181a is deposited. A growth rate of the variable resistance material layer per basic cycle is about 0.6~1 angstrom. If a suitable thickness of the first variable resistance material layer 18a is 5 nm, the first variable resistance material layer 18a with a suitable thickness can be deposited by repeating the basic cycle 50~80 times.

An amount of the source gas introduced into the chamber 301 in the first step is preferably set so that the mono-molecular layer of the source gas is deposited over the entire surface of the substrate. In other words, the amount of the source gas introduced in the first step is preferably set so that the sites of the substrate surface are saturated with the molecules of the source gas (reaction-limited state is attained) (see Experiment example 1 and Experiment example 2). The introduction amount of the source gas for attaining the reaction-limited state can be derived from a relationship between the introduction amount of the source gas and the growth rate of the variable resistance material layer, as in, for example, Experiment example 1.

Preferably, an amount of the reactive gas introduced into the chamber 301 in the third step is set so that oxidation of the mono-molecular layer of the source gas deposited on the substrate surface is completed substantially perfectly (reaction-limited state is attained) (see Experiment example 1 and Experiment example 2). Thus, the oxygen content of the first variable resistance layer 18a can be made higher. The introduction amount of the reactive gas for attaining the reaction-limited state can be derived from a relationship between the introduction amount of the reactive gas and the growth rate of the variable resistance material layer, as in, for example, Experiment example 2.

A pressure within the chamber 301 in the first step included in the step of forming the first variable resistance layer is preferably lower than a pressure within the chamber 301 in the first step included in the step of forming the second variable resistance layer. A pressure within the chamber 301 in the third step included in the step of forming the first variable resistance layer is preferably lower than a pressure within the chamber 301 in the third step included in the step of forming the second variable resistance layer. As defined herein, the pressure refers to a total gas pressure, i.e., total pressure of the gas present within the chamber 301.

Preferably, an amount of the reactive gas introduced into the chamber 301 in the third step included in the step of forming the first variable resistance layer is more than an amount of the reactive gas introduced into the chamber 301 in the third step included in the step of forming the second variable resistance layer.

Then, as shown in FIG. 5B, on the first variable resistance material layer 181a deposited on the interlayer insulating layer 16 and side walls and bottom portions of the memory cell holes 29, the second variable resistance material layer 181b (second deposited layer) which will become the second variable resistance layers 18b, is deposited. In the present embodiment, the second variable resistance material layer 181b is formed in such a manner that tantalum oxide is deposited on insides (side walls and bottom portions) of holes 29' defined by a portion of the first variable resistance material layer 181a and a portion of the first variable resistance material layer 181a on the interlayer insulating layer 16, by the ALD mode or the CVD mode.

In the present embodiment, the second variable resistance material layer 181b is formed by the ALD mode or the CVD mode. Specifically, in the case of using the ALD mode, the manufacturing method of the second variable resistance material layer 181b includes performing once or plural times, a cycle consisting of a first step of introducing the source gas containing atoms of the transition metal, a second step of purging the source gas after the first step, a third step of introducing the reactive gas after the second step, and a fourth step of purging the reactive gas after the third step.

The forming method of the second variable resistance material layer 181b is identical to the forming method of the first variable resistance material layer 181a except for the substrate temperature and the amount of the reactive gas introduced into the chamber 301 in the third step. Therefore, process steps common to the forming method of the second variable resistance material layer 181b and forming method of the first variable resistance material layer 181a will not be described in repetition.

The formation of the second variable resistance material layer 181b is performed in succession to the formation of the first variable resistance material layer 181a within the same chamber 301.

The step of forming the second variable resistance material layer 181b is performed in the ALD mode in the case where the substrate is kept at the temperature at which the self-decomposition reaction of the source gas does not occur, while the step of forming the second variable resistance material layer 181b is performed in the CVD mode in the case where the substrate is kept at the temperature at which the self-decomposition reaction of the source gas occurs. The use of the ALD mode allows the second variable resistance material layer 181b to be easily deposited as a dense and conformal layer. The use of the CVD mode allows the oxygen content of the second variable resistance material layer 181b to be easily made lower than that in the case of the use of the ALD mode (see Experiment example 3).

Preferably, an amount of the reactive gas introduced into the chamber 301 in the third step is set so that oxidation of the mono-molecular layer of the source gas deposited on the substrate surface is not completed substantially perfectly (supply-limited state is attained) (see Experiment example 1 and Experiment example 2). This allows the oxygen content of the second variable resistance layer 18b to be lower than the oxygen content of the first variable resistance layer 18a. With this structure, the resistance changing phenomenon takes place in a portion of the first variable resistance layer 18a which is in the vicinity of the interface between the lower electrode wire 151 and the first variable resistance layer 18a, and an operation of the element is stabilized. The introduction amount of the reactive gas with which the supply-limited state is attained can be derived based on the relationship between the introduction amount of the reactive gas and the growth rate of the variable resistance material layer, as in, for example, Experiment example 2.

In the case where the oxygen content of the first variable resistance layer 18a is made lower than the oxygen content of the second variable resistance layer 18b, for example, in the step of forming the first variable resistance material layer 181a, the ALD mode is carried out and the amount of the reactive gas introduced into the chamber 301 in the third step is set so that oxidation of the mono-molecular layer of the source gas deposited on the substrate surface is not completed substantially perfectly (supply-limited state is attained). In addition, in the step of forming the second variable resistance material layer 181b, the ALD mode or the CVD mode is carried out, and the amount of the reactive gas introduced into the chamber 301 in the third step is set so that oxidation of the mono-molecular layer of the source gas deposited on the substrate surface is completed substantially perfectly (reaction-limited state is attained).

It is difficult to deposit the layer which is physically in contact with the inner wall and bottom portion of the memory cell hole 29 such that the layer has a uniform thickness. This problem can be solved by depositing the layer by the ALD mode. Besides, by controlling the amount of the reactive gas introduced into the chamber in the third step, the oxygen content of the variable resistance material layer to be deposited can be controlled, and thereby two or more layers having desired oxygen contents and desired thicknesses can be deposited.

It is presumed that, in a case where the transition metal oxide constituting the variable resistance layer is an oxygen-deficient hafnium oxide, an oxygen-deficient zirconium oxide, an oxygen-deficient nickel oxide, or an oxygen-deficient titanium oxide, metal oxides which are different in oxygen content from each other can be deposited as in the case of the tantalum oxide, in view of a principle of deposition of the layer. In this case, as a raw material (precursor) of the variable resistance layer, zirconium chloride [$ZiCl_4$], tetra (ethylmethylamino)hafnium [$Hf(NCH_3C_2H_5)_4$], nickel1-dimethylamino-2-methyl-2butanolate [$Ni(C_7H_{16}NO)$], tetra-ethoxytitanium ($Ti(OC_3H_7)_4$), etc., may be used.

Thereafter, as shown in FIG. 5C, the intermediate electrode material layer 191 is formed on the second variable resistance material layer 181b. In the present embodiment, the intermediate electrode material layer 191 is formed in such a manner that tantalum nitride (TaN) is deposited on insides (side walls and bottom portions) of the holes 29″ defined by the portion of the second variable resistance material layer 181b and on the portion of the second variable resistance material layer 181b on the first variable resistance material layer 181a on the interlayer insulating layer 16, by, for example, the ALD mode or the CVD mode. The specific method of the ALD mode or the CVD mode is similar to that corresponding to the first variable resistance material layer 181a or the second variable resistance material layer 181b, and will not be described in repetition. As the raw material (precursor), TBTDET, $TaCl_5$ or the like may be used. As the reactive gas, $NH_3$ or the like may be used.

Then, as shown in FIG. 6B, by the CMP process, portions of the intermediate electrode material layer 191 and of the variable resistance material layers 181b and 181a which cover an upper surface of the interlayer insulating layer 16 and are located above the upper openings of the memory cell holes 29 (portions which are in a higher level from the substrate than an upper end surface of the interlayer insulating layer 16) are removed. Thereby, in each of the memory cell holes 29, the first variable resistance layer 18a, the second variable resistance layer 18b, and the intermediate electrode 19 are left. FIG. 6A is a plan view when viewed from above.

Alternatively, in the step of FIG. 5B, the second variable resistance material layer 181b may be fully filled into the holes 29′. In this case, for example, by the CMP, portions of the first variable resistance material layer 181a and of the second variable resistance material layer 181b, which portions cover the upper surface of the interlayer insulating layer 16 and are located above the upper openings of the memory cell holes 29 (portions which are in a higher level from the substrate than the upper end surface of the interlayer insulating layer 16) are removed. Then, portions of the first variable resistance material layer 181a and of the second variable resistance material layer 181b which are located in the vicinity of the openings of the holes are removed by etch-back. Then, the intermediate electrode material layer 191 is deposited to fill concave portions formed by the etch-back. Further, by the CMP, portions of the intermediate electrode material layer 191 which cover the upper surface of the interlayer insulating layer 16 and are located above the upper openings of the memory cell holes 29 (portions which are in a higher level from the substrate than the upper end surface of the interlayer insulating layer 16) are removed. In this method, the intermediate electrode 19 is filled up to the entire upper opening of each of the memory cell holes 29.

Then, as shown in FIG. 7B, the current steering layer 21 and the upper electrode wire 22 are formed in this order such that they are connected to the intermediate electrode 19. As the specific method of this, a known technique in this art can be employed, and its description is omitted. At this time, as shown in FIG. 7A, the current steering layers 21 and the upper electrode wires 22 are formed on the interlayer insulating layer 16 in such a manner that when viewed from the thickness direction of the substrate, the current steering layers 21 and the upper electrode wires 22 have a greater shape (area) than at least the openings of the memory cell holes 29 so as to cover the entire openings of the memory cell holes 29 and have a stripe shape so as to cross the lower electrode backing wires 15 and the lower electrode wires 151. The upper electrode wires 22 are extended to outside of the region in which the variable resistance elements 17 and the current steering elements 20 are formed in matrix. Concurrently with the formation of the upper electrode wires 22, the vertical contacts or vias 28 are formed. Via the vertical contact or via 28, each of the upper electrode wires 22 is connected to the semiconductor circuit wire (not shown) and electrically connected to the active element provided in a location which is not shown. In the case of using $SiN_z$ as the current steering layer 21, a current steering layer having good characteristics and a high density can be easily formed by depositing $SiN_z$ by the reactive sputtering.

Moreover, the insulating protective layer 23 is formed to cover the interlayer insulating layer 16, the current steering layers 21 and the upper electrode wires 22, thereby attaining the non-volatile memory device of FIG. 1.

Modified Example

Next, a manufacturing method of a non-volatile memory device according to a modified example of the present embodiment will be described with reference to FIGS. 12 to 14. In FIGS. 12 to 14, for easier illustration, the modified example of the interlayer insulating layer 14 and the constituents located above the interlayer insulating layer 14 in the example of FIG. 1 is illustrated.

Figure 12A:
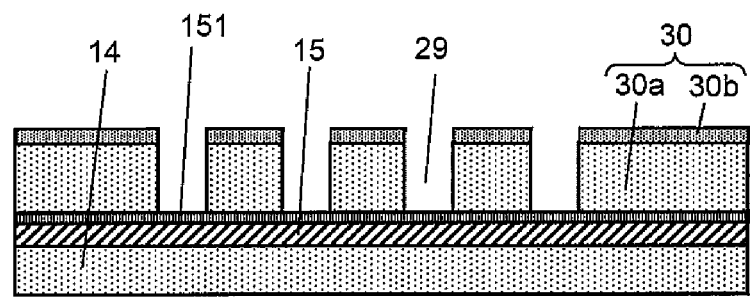
FIG. 12A is a view showing steps of filling a variable resistance layer and an intermediate electrode into each of the memory cell holes 29 provided in an interlayer insulating layer 30 and is a cross-sectional view showing a state in which the memory cell holes 29 have been formed, in a manufacturing method of a non-volatile memory device according to a modified example of Embodiment 1 of the present invention.
Figure 12B:
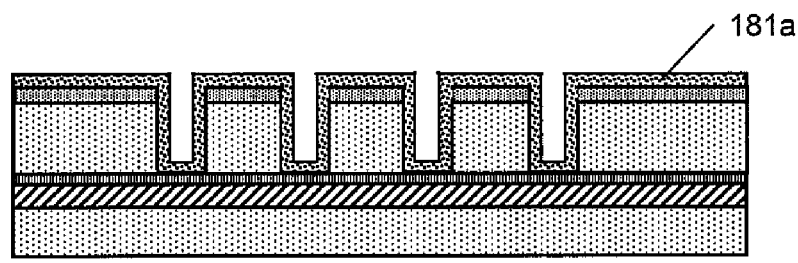
FIG. 12B is a view showing steps of filling the variable resistance layer and the intermediate electrode into each of the memory cell holes 29 provided in the interlayer insulating layer 30, and is a cross-sectional view showing a state in which the first variable resistance material layer 181a has been formed, in the manufacturing method of the non-volatile memory device according to the modified example of Embodiment 1 of the present invention.
Figure 12C:
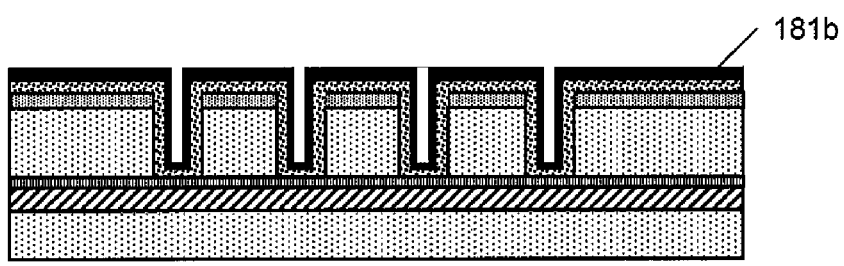
FIG. 12C is a view showing steps of filling the variable resistance layer and the intermediate electrode into each of the memory cell holes 29 provided in the interlayer insulating layer 30, and is a cross-sectional view showing a state in which the second variable resistance material layer 181b has been formed on the first variable resistance material layer 181a, in the manufacturing method of the non-volatile memory device according to the modified example of Embodiment 1 of the present invention.
Figure 12D:
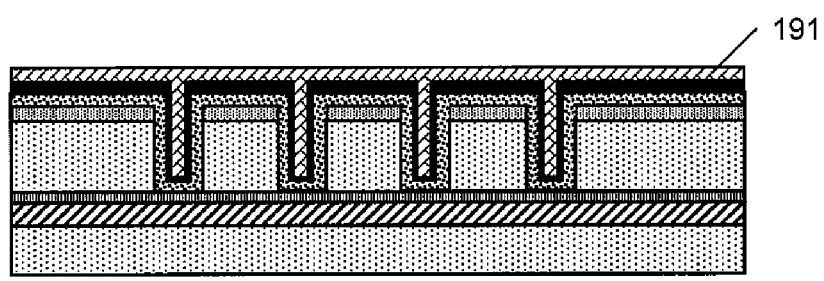
FIG. 12D is a view showing steps of filling the variable resistance layer and the intermediate electrode into each of the memory cell holes 29 provided in the interlayer insulating layer 30, and is a cross-sectional view showing a state in which the intermediate electrode material layer 191 has been formed on the second variable resistance material layer 181b, in the manufacturing method of the non-volatile memory device according to the modified example of Embodiment 1 of the present invention.
Figure 12E:
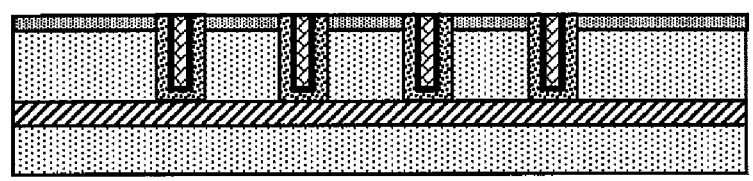
FIG. 12E is a view showing steps of filling the variable resistance layer and the intermediate electrode into each of the memory cell holes 29 provided in the interlayer insulating layer 30, and is a cross-sectional view showing a state in which a portion of the first variable resistance material layer 181a, a portion of the second variable resistance material layer 181b, and a portion of the intermediate electrode material layer 191 which are on the interlayer insulating layer 30 have been removed by CMP, in the manufacturing method of the non-volatile memory device according to the modified example of Embodiment 1 of the present invention.

FIGS. 12A to 12E are views showing steps of filling the variable resistance layer and the intermediate electrode into each of the memory cell holes 29 provided in the interlayer insulating layer 30, in the manufacturing method of the non-volatile memory device according to the modified example of Embodiment 1 of the present invention. FIG. 12A is a cross-sectional view showing a state in which the memory cell holes 29 have been formed. FIG. 12B is a cross-sectional view showing a state in which the first variable resistance material layer 181a has been formed. FIG. 12C is a cross-sectional view showing a state in which the second variable resistance material layer 181b has been formed on the first variable resistance material layer 181a. FIG. 12D is a cross-sectional view showing a state in which the intermediate electrode material layer 191 has been formed on the second variable resistance material layer 181b. FIG. 12E is a cross-sectional view showing a state in which a portion of the first variable resistance material layer 181a, a portion of the second variable resistance material layer 181b, and a portion of the intermediate electrode material layer 191 which are on the interlayer insulating layer 30 have been removed by CMP.

Figure 13A:
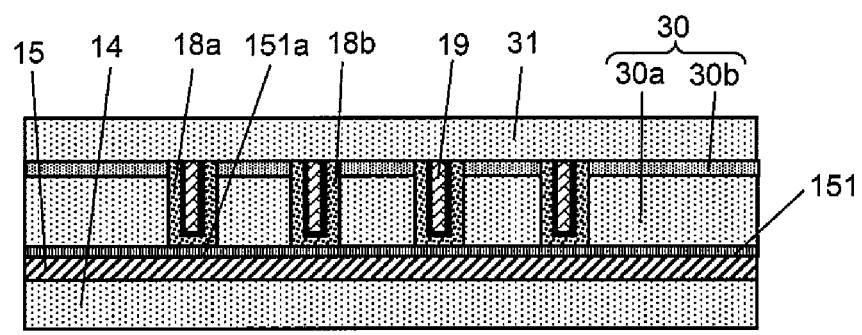
FIG. 13A is a view showing steps of filling the first variable resistance layer 18a, the second variable resistance layer 18b and the intermediate electrode 19 into each of the memory cells 29, and forming channels 32 in an interlayer insulating layer 31, and is a cross-sectional view showing a state in which the interlayer insulating layer 31 has been formed, in the manufacturing method of the non-volatile memory device according to the modified example of Embodiment 1 of the present invention.
Figure 13B:
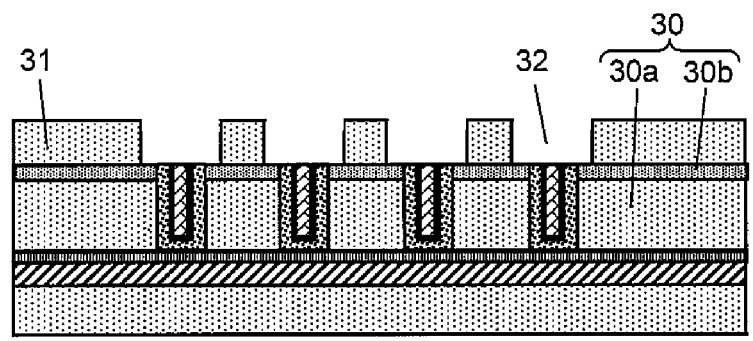
FIG. 13B is a view showing steps of filling the first variable resistance layer 18a, the second variable resistance layer 18b and the intermediate electrode 19 into each of the memory cells 29, and forming the channels 32 in the interlayer insulating layer 31, and is a cross-sectional view showing a state in which the channels 32 have been formed in interlayer insulating layer 31, in the manufacturing method of the non-volatile memory device according to the modified example of Embodiment 1 of the present invention.

FIGS. 13A and 13B are views showing steps of filling the first variable resistance layer 18a, the second variable resistance layer 18b and the intermediate electrode 19 into each of the memory cell holes 29, and forming the channels 32 in an interlayer insulating layer 31 in the manufacturing method of the non-volatile memory device according to the modified example of Embodiment 1 of the present invention. FIG. 13A is a cross-sectional view showing a state in which the interlayer insulating layer 31 has been formed. FIG. 13B is a cross-sectional view showing a state in which the channels 32 have been formed in the interlayer insulating layer 31.

Figure 14A:
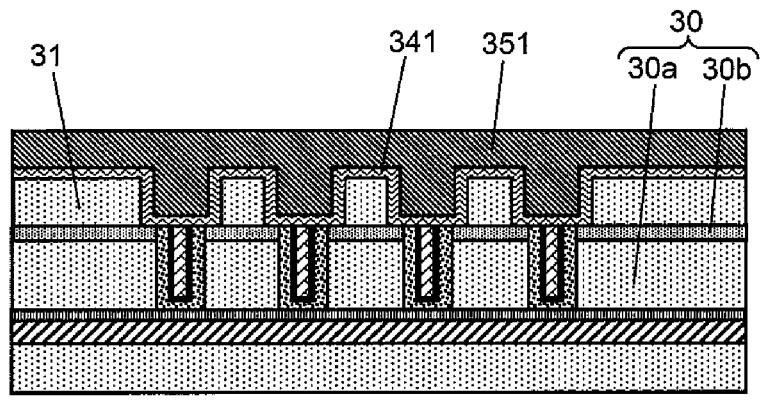
FIG. 14A is a view showing steps of filling a current steering layer 34 and an upper electrode 35 into each of the channels 32 and is a cross-sectional view showing a state in which a current steering material layer 341 which will become the current steering layers 34 and an electrode material layer 351 which will become the upper electrodes 35 have been formed on the interlayer insulating layer 31 provided with the channels 32, in the manufacturing method of the non-volatile memory device according to the modified example of Embodiment 1 of the present invention.
Figure 14B:
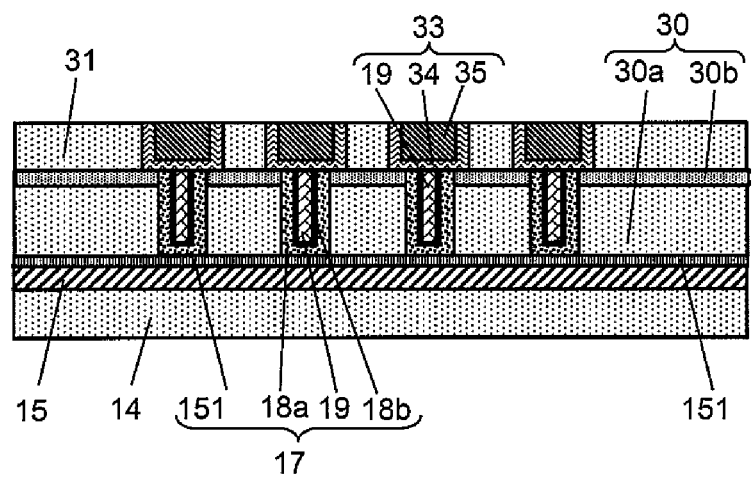
FIG. 14B is a view showing steps of filling the current steering layer 34 and the upper electrode 35 into each of the channels 32 and is a cross-sectional view showing a state in which a portion of the electrode material layer 351 and a portion of the current steering material layer 341 which are on the interlayer insulating layer 31 have been removed by CMP and the current steering layer 34 and the upper electrode 35 have been filled into each of the channels 32, in the manufacturing method of the non-volatile memory device according to the modified example of Embodiment 1 of the present invention.

FIGS. 14A are 14B are views showing steps of filling a current steering layer 34 and an upper electrode 35 into each of the channels 32 in the manufacturing method of the non-volatile memory device according to the modified example of Embodiment 1 of the present invention. FIG. 14A is a cross-sectional view showing a state in which a current steering material layer 341 which will become the current steering layers 34 and an electrode material layer 351 which will become the upper electrodes 35 have been formed on the interlayer insulating layer 31 provided with the channels 32. FIG. 14B is a cross-sectional view showing a state in which a portion of the electrode material layer 351 and a portion of the current steering material layer 341 which are on the interlayer insulating layer 31 have been removed by CMP and the current steering layer 34 and the upper electrode 35 have been filled into each of the channels 32.

Initially, as shown in FIG. 12A, a first insulating layer 30a comprising TEOS-SiO and a second insulating layer 30b comprising, for example, SiON having higher hardness than TEOS-SiO, are deposited by, for example, the CVD method, on the substrate (not shown) provided with the lower electrode backing wires 15 and the lower electrode wires 151 embedded in the interlayer insulating layer 14. The interlayer insulating layer 30 is composed of the first insulating layer 30a and the second insulating layer 30b. The second insulating layer 30b serves as a stopper in the CMP process. By forming the second insulating layer 30b, the CMP process can be carried out easily and surely.

Then, the memory cell holes 29 are formed in specified arrangement pitches in the interlayer insulating layer 30 on the lower electrode wires 151. The memory cell holes 29 have a smaller outer shape than a width of the lower electrode wires 151. Manufacturing steps and shape of the memory cell holes 29 are similar to those described with reference to FIGS. 4 to 7.

Then, as shown in FIGS. 12B and 12C, on the interlayer insulating layer 30 provided with the memory cell holes 29, the first variable resistance material layer 181a (first deposited layer) which will become the first variable resistance layers 18a and the second variable resistance material layer 182b (second deposited layer) which will become the second variable resistance layers 18b, are deposited. In the present embodiment, the oxygen-deficient tantalum oxide ($TaO_x$) is deposited by the ALD mode as the first variable resistance material layer 181a and the second variable resistance material layer 182b. An oxygen content of the first variable resistance layer 18a is preferably higher than an oxygen content of the second variable resistance layer 18b. A forming method of the first variable resistance material layer 181a and a forming method of the second variable resistance material layer 182b is similar to that of Embodiment 1 and will not be described in repetition.

Then, after forming the intermediate electrode material layer 191 as shown in FIG. 12D, portions of the intermediate electrode material layer 191, of the first variable resistance material layer 181a and of the second variable resistance material layer 181b, which are located on the interlayer insulating layer 30 are removed by the CMP process, to leave the first variable resistance layer 18a, the second variable resistance layer 18b and the intermediate electrode 19 into each of the memory cell holes 29 as shown in FIG. 12E. At this time, the second insulating layer 30b of the interlayer insulating layer 30 serves as the stopper in the CMP process for removing the portions of the first and second variable resistance material layers and of the intermediate electrode material layer, because the second insulating layer 30b has a lower polishing rate than the first insulating layer 30a in the CMP process. The second insulating layer 30b is not substantially polished, and only unnecessary portions of the intermediate electrode material layer 191, of the first variable resistance material layer 181a and of the second variable resistance material layer 181b can be removed surely.

Then, as shown in FIG. 13A, the interlayer insulating layer 31 is formed on the interlayer insulating layer 30, and the first variable resistance layer 18a, the second variable resistance layer 18b and the intermediate electrode 19 inside each of the memory cell holes 29. The interlayer insulating layer 31 is formed to have a thickness required to embed the current steering layers 34 and the upper electrodes 35 thereinto. As a material of the interlayer insulating layer 31, TEOS-SiO may be used, or another interlayer insulating material generally used in the semiconductor device may be used. Or, like the interlayer insulating layer 30, a stacked-layer structure may be formed, in which an interlayer insulating layer having higher hardness is formed as an upper layer.

Then, as shown in FIG. 13B, the channels 32 of a stripe shape when viewed from the thickness direction of the substrate are formed in such a manner that the channel 32 exposes the first variable resistance layer 18a, the second variable resistance layer 18b and the intermediate electrode 19 in the upper opening of each of the memory cell holes 29 and crosses the lower electrode backing wire 15 and the lower electrode wire 151. This process can be performed by a general semiconductor process such as dry etching.

Then, as shown in FIG. 14A, on the interlayer insulating layer 31 provided with the channels 32, the current steering material layer 341 which will become the current steering layers 34 and the electrode material layer 351 which will become the upper electrodes 35 are formed. As materials of the current steering material layer 341 and the electrode material layer 351, the same materials as those described in the present embodiment can be used in the same manner.

Then, as shown in FIG. 14B, by the CMP process, portions of the electrode material layer 351 and of the current steering material layer 341 which are on the interlayer insulating layer 31 are removed, thereby leaving the current steering layer 34 and the upper electrode 35 filled inside of each of the channels 32.

Through the above steps, each of the variable resistance elements 17 is formed to include the variable resistance layer 18, a portion of the lower electrode wire 151 and a portion of the intermediate electrode 19 between which the variable resistance layer 18 is sandwiched. In addition, each of the current steering elements 33 is formed to include the intermediate electrode 19, the current steering layer 34 and the upper electrode 35.

Thereafter, an insulating protective layer (not shown) for protecting the upper electrodes is formed. Thus, it is possible to manufacture the non-volatile memory device according to the modified example of the present embodiment.

In the non-volatile memory device manufactured by the above described manufacturing method, the current steering layer 34 and the upper electrode 35 are embedded in the interlayer insulating layer 31. Therefore, in a case where the variable resistance element 17 and the current steering element 33 are further stacked, the step of stacking them can be performed easily.

In the non-volatile memory device of the present modified example, as shown in FIG. 14B, the current steering layer 34 having a substantially-U-shaped cross section is provided to cover a lower surface and side surfaces of each of the upper electrodes 35. If the current steering layer 34 is formed by a nitride material, it can function as a barrier layer against a metal, oxygen, hydrogen, etc.

Embodiment 2

Figure 15:
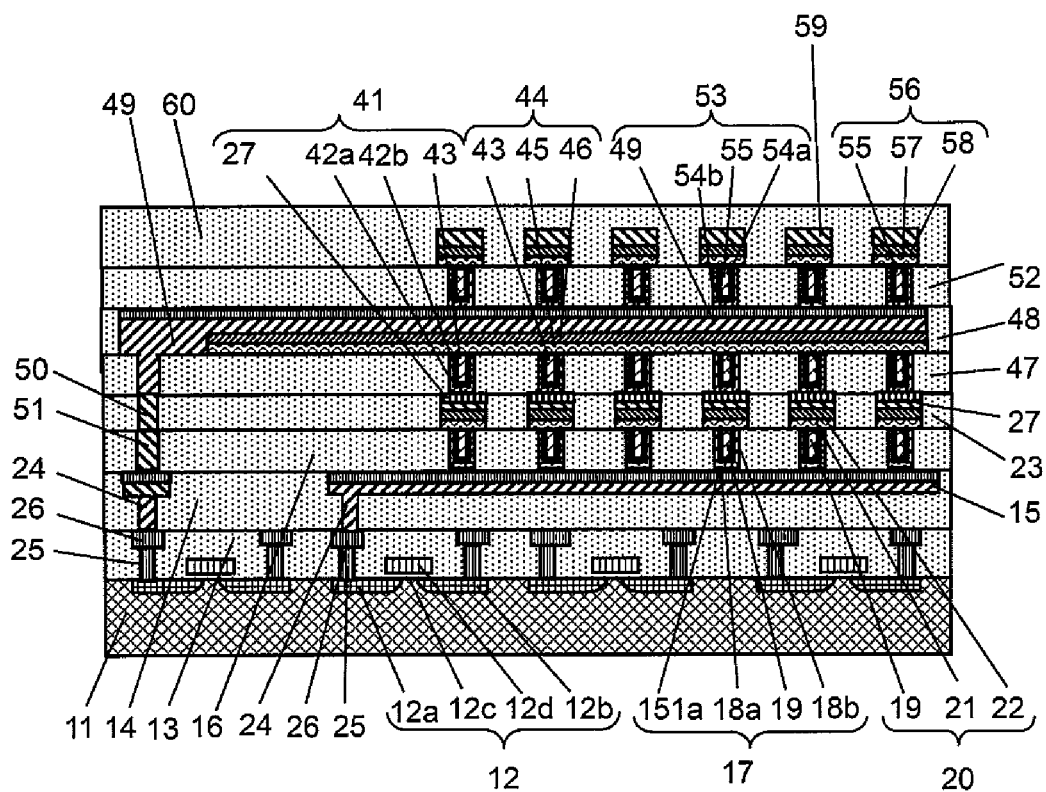
FIG. 15 is a cross-sectional view showing a configuration of a non-volatile memory device 40 according to Embodiment 2 of the present invention.

FIG. 15 is a cross-sectional view showing a configuration of a non-volatile memory device 40 according to Embodiment 2 of the present invention. The non-volatile memory device 40 includes the non-volatile memory device 10 of Embodiment 1 as shown in FIG. 1, as base constituents and is configured in such a manner that two constituent units each of which is composed of the interlayer insulating layer, the variable resistance layer and the current steering element filled inside each of the memory cell holes formed in the interlayer insulating layer are stacked on the base constituents. With the stacked-layer structure, the non-volatile memory device with a higher capacity is attainable.

Hereinafter, the configuration of the non-volatile memory device 40 of the present embodiment will be described in brief. In the non-volatile memory device 10 of FIG. 1, each of the upper electrode wires 22 is extended to outside of the region in which the variable resistance elements 17 and the current steering elements 20 are formed in matrix. On the other hand, in the non-volatile memory device 40 of the present embodiment, an upper electrode wire 27 which is a constituent different from the upper electrode wire 22 is provided to extend on each of the upper electrode wires 22 within the matrix region. The same applies to a second layer structure and a third layer structure. In the non-volatile memory device 40, each of the variable resistance element and the current steering element is stacked in three layers. The constituents in the first layer, the constituents in the second layer and the constituents in the third layer are expressed as first-layer constituents, second-layer constituents, and third-layer constituents, respectively, for easier understanding of these constituents.

A second-layer interlayer insulating layer 47 is formed on the first-layer interlayer insulating layer 23 provided with the first-layer upper electrode wires 27. The second-layer interlayer insulating layer 47 is provided with memory cell holes in locations corresponding to the first-layer variable resistance elements 17, respectively. Inside of each of the memory cell holes, a second-layer variable resistance layer 42 and a second-layer common electrode 43 are filled. Second-layer current steering layers 45, second-layer upper electrodes 46 and second-layer upper electrode wires 49 are formed such that they are connected to the second-layer common electrodes 43 and have a stripe shape so as to cross the first-layer upper electrode wires 27 when viewed from the thickness direction of the substrate. A third-layer interlayer insulating layer 48 is formed to embed the second-layer current steering layers 45, the second-layer upper electrodes 46 and the second-layer upper electrode wires 49 thereinto.

On the second-layer upper electrode wires 49 and the third-layer interlayer insulating layer 48, a fourth-layer interlayer insulating layer 52 is formed. The fourth-layer interlayer insulating layer 52 is provided with memory cell holes in locations corresponding to the first-layer variable resistance elements 17 (first-layer memory sections) and the second-layer variable resistance elements 41 (second-layer memory sections). Inside of each of the memory cell holes, a third-layer variable resistance layer 54 and a third-layer common electrode 55 are filled. Third-layer current steering layers 57, third-layer upper electrodes 58, and third-layer upper electrode wires 59 are formed such that they are connected to the third-layer common electrodes 55 and have a stripe shape so as to cross the second-layer upper electrode wires 49, respectively, when viewed from the thickness direction of the substrate. Further, an insulating protective layer 60 is formed to embed the third-layer current steering layers 57, the third-layer upper electrodes 58, and the third-layer upper electrode wires 59 therein.

Each of the second-layer variable resistance elements 41 (second-layer memory section) comprises the second-layer variable resistance layer 42, a portion of the first-layer upper electrode wire 27 and a portion of the second-layer common electrode 43 between which the second-layer variable resistance layer 42 is sandwiched. Each of the second-layer current steering elements 44 comprises the second-layer common electrode 43, the second-layer current steering layer 45 and the second-layer upper electrode 46. Each of the third-layer variable resistance elements 53 (third-layer memory section) comprises a third-layer variable resistance layer 54, a portion of a second-layer upper electrode wire 49 and a portion of a third-layer common electrode 55 between which the third-layer variable resistance layer 54 is sandwiched. Each of the third-layer current steering elements 56 comprises the third-layer common electrode 55, a third-layer current steering layer 57 and a third-layer upper electrode 58.

Each of the lower electrode backing wires 15 is connected to the source region 12a of the active element 12 via the vertical contacts or vias 24 and 25 and the semiconductor circuit wire 26. In the same manner, each of the first-layer upper electrode wires 27 is connected to another active element (not shown) via a vertical contact or via (not shown) and a semiconductor circuit wire (not shown). As shown in FIG. 15, each of the second-layer upper electrode wires 49 is connected to the source region 12a of another active element 12 via vertical contacts or vias 24, 25, 50 and 51 and the semiconductor circuit wire 26. Like the first-layer upper electrode wire 27, the third-layer upper electrode wire 59 is connected to another active element (not shown) via a vertical contact or via (not shown) and a semiconductor circuit wire (not shown).

The first-layer lower electrode backing wires 15 or the first-layer upper electrode wires 27 become the bit lines or the word lines and are connected to a bit line decoder or a word line decoder in a circuit of FIG. 3. The first-layer upper electrode wires 27 or the second-layer upper electrode wires 49 become the bit lines or the word lines and are connected to the bit line decoder or the word line decoder in the circuit of FIG. 3. The non-volatile memory device 40 is designed so that in a case where the first-layer upper electrode wires 27 constitute the bit lines in the first layer, they also constitute the bit lines in the second layer, while the second-layer upper electrode wires 49 constitute the word lines. The non-volatile memory device 40 is also designed so that in a case where the second-layer upper electrode wires 49 constitute the word lines, the third-layer upper electrode wires 59 constitute the bit lines.

As described above, in the non-volatile memory device 40 of the present embodiment, the current steering elements 20, 44, and 56 are individually provided to correspond to the variable resistance elements 17, 41 and 53, in the respective layers. This makes it possible to stably and surely write and read data to and from the variable resistance elements 17, 33 and 45 provided in the respective layers.

The manufacturing process steps of the non-volatile memory device 40 including the memory sections and the current steering elements in the above stated multi-layered structure, is implemented by fundamentally repeating the manufacturing method of the non-volatile memory element 10 of Embodiment 1 or the manufacturing method of the modified example.

Embodiment 3

Figure 16:
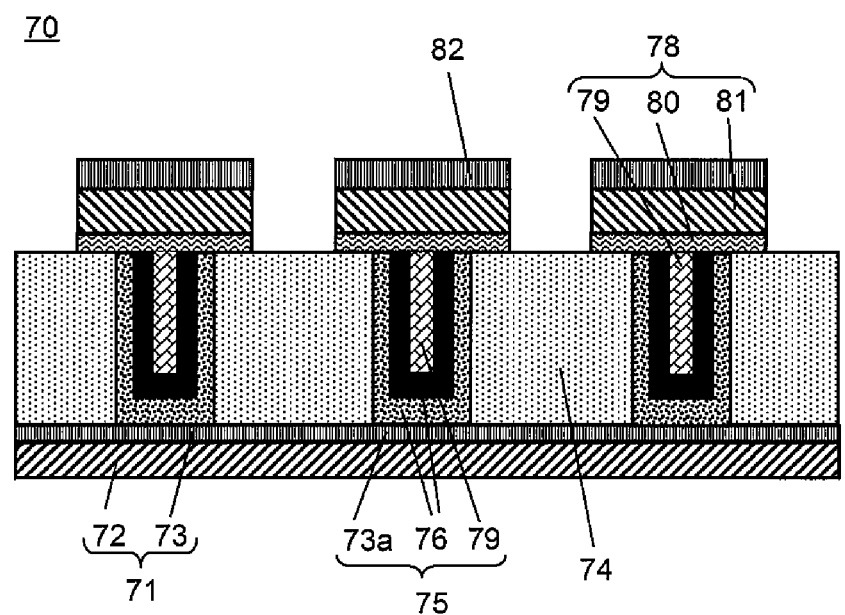
FIG. 16 is a cross-sectional view showing a configuration of a memory section 75 and a current steering element 78 which are major constituents of a non-volatile memory device 70 according to Embodiment 3 of the present invention.

FIG. 16 is a cross-sectional view showing a configuration of variable resistance elements 75 and current steering elements 78 which are constituents of a non-volatile memory device 70 according to Embodiment 3 of the present invention.

In the non-volatile memory device 70 of the present embodiment, each of lower electrode wires 71 is composed at least two layers which are a connection electrode 73 connected to a variable resistance layer 76 and a lower wire 72 formed on a lower portion of the connection electrode 73 using an electric conductor material comprising, for example, Al or Cu, which is typically used in semiconductor process steps.

The non-volatile memory device 70 of the present embodiment includes semiconductor layers 80, upper electrodes 81 and connection electrodes 82 such that they are connected to the common electrodes 79 and have a stripe shape so as to cross the lower electrode wires 71, respectively when viewed from the thickness direction of the substrate. Although each of the connection electrodes 82 is extended to a region outside of the matrix region and connected to the upper electrode wire (not shown), the connection electrode 82 may be configured to serve as the upper electrode wire. The other constituents are identical to those of the non-volatile memory device 10 of Embodiment 1 and will not be described in repetition.

In the above configuration, each of the memory sections 75 comprises the variable resistance layer 76, a portion of a connection electrode 73a and a portion of the common electrode 79 which is an embedded metal electrode layer, between which portions the variable resistance layer 76 is sandwiched. A current steering element 78 comprises an MSM diode including the common electrode 79 which is the metal electrode layer, the upper electrode 81 and the semiconductor layer 80. The common electrode 79 which is the metal electrode layer is filled in each of the memory cell holes.

The present embodiment has a feature that the current steering element 78 comprises the MSM diode configured such that the common electrode 79 and the upper electrode 81 comprise Al and the semiconductor layer 80 comprises a nitrogen-deficient silicon nitride ($SiN_z$) layer. The $SiN_z$ layer having a semiconductive property may be deposited by performing reactive sputtering using, for example, a Si target in a nitrogen gas atmosphere. For example, the $SiN_z$ layer may be deposited under, for example, conditions in which a temperature is a room temperature, a pressure in the chamber is set to 0.1 Pa~1 Pa, and an $Ar/N_2$ flow rate is 18 sccm/2 sccm.

The common electrode 79 and the upper electrode 81 may comprise Pt instead of Al. In a case where the $SiN_z$ layer having the semiconductive property was deposited under the above stated conditions and with a thickness of 16 nm, a current density of $2.5 \times 10^3$ A/cm$^2$ was obtained by applying a voltage of 1.6V and a current density of $5 \times 10^2$ A/cm$^2$ was obtained by applying a voltage of 0.8V. Therefore, in the case where these voltages were used as reference voltages, an ON/OFF ratio was 5. Thus, it could be confirmed that this $SiN_z$ layer was satisfactory for use as the current steering element of the non-volatile memory device.

Although in the present embodiment, the connection electrode 73 is provided on a lower electrode surface of the variable resistance layer 76, this is not always essential. For example, the connection electrode 73 may be omitted depending on a selected material of the variable resistance layer 76. In this case, the non-volatile memory device 40 may be configured like the non-volatile memory device 10 of Embodiment 1.

Embodiment 4

Figure 17A:
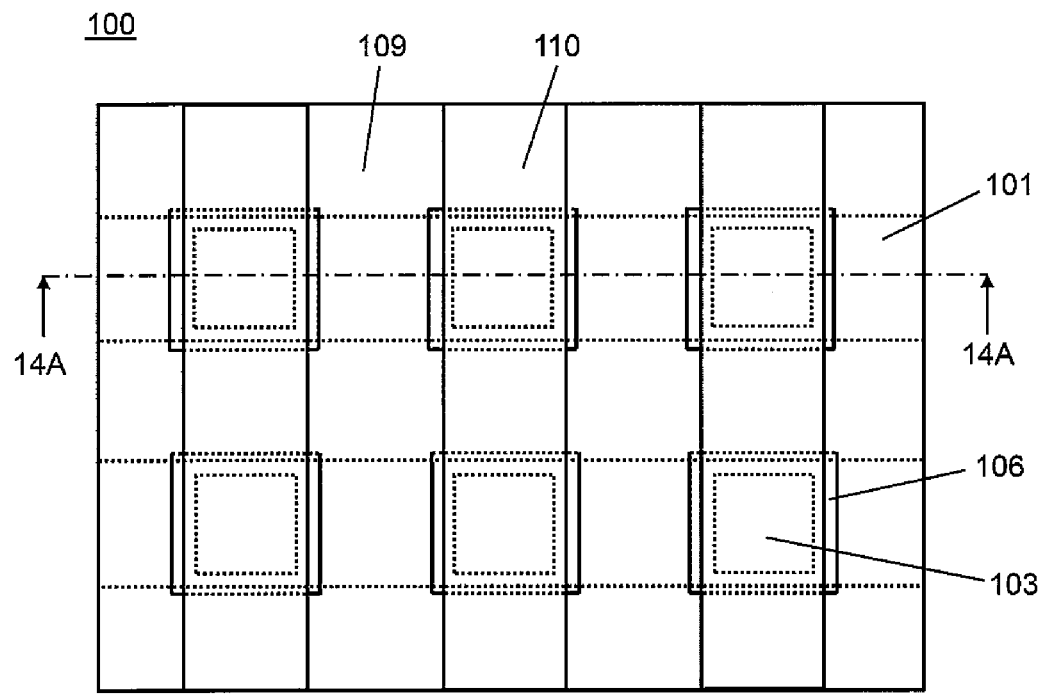
FIG. 17A is a plan view showing a configuration of a memory section 103 and a current steering element 106 which are major constituents of a non-volatile memory device 100 according to Embodiment 4 of the present invention.
Figure 17B:
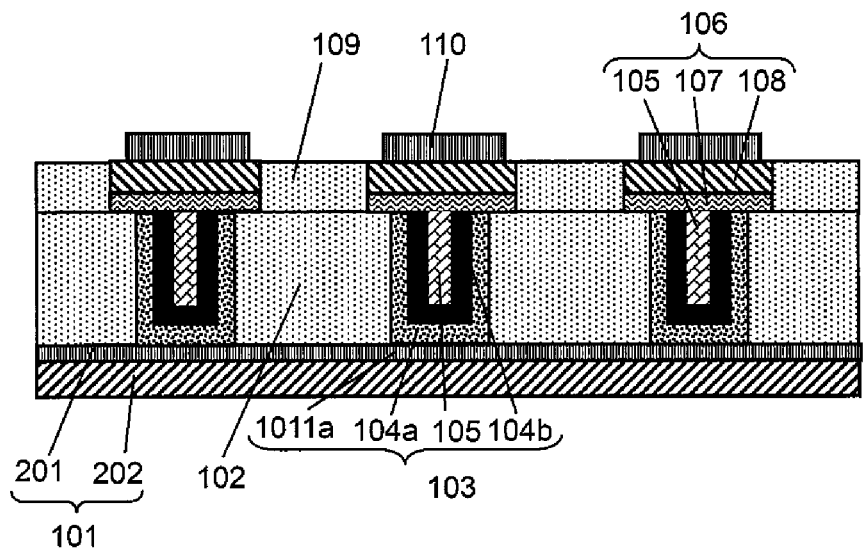
FIG. 17B is a cross-sectional view taken in the direction of arrow along 14A-14A of FIG. 17A.
Figure 18:
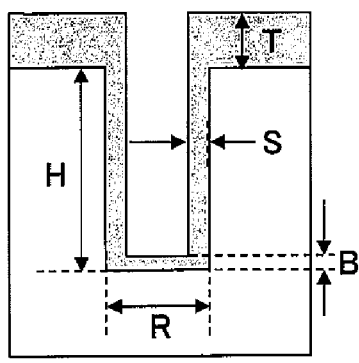
FIG. 18 is a conceptual view of "aspect ratio" and "bottom coverage" which is in conjunction with the present inventors' study.

FIGS. 17A and 17B are views each showing a configuration of memory sections 103 and current steering elements 106 which are major constituents of a non-volatile memory device 100 according to Embodiment 4 of the present invention. FIG. 17A is a plan view and FIG. 17B is a cross-sectional view taken in the direction of arrow along 14A-14A of FIG. 17A. The non-volatile memory device 100 of the present embodiment basically has the same configuration as that of the non-volatile memory device 10 of Embodiment 1, but has a feature that a current steering layer 107 and an upper electrode 108 constituting the current steering element 106 are separately formed for each of the memory sections 103. Because of this, the upper electrode wires 110 are formed on the interlayer insulating layer 109 embedded with the current steering elements 106 such that they are connected to the upper electrodes 108, and have a stripe shape so as to cross the lower electrode wires 101, respectively, when viewed from the thickness direction of the substrate. In the non-volatile memory device 100 of the present embodiment, each of the lower electrode wires 101 is composed of at least two layers which are a connection electrode 202 connected to a variable resistance layer 104a and a lower wire 202 formed on a lower portion of the connection electrode 201 using an electric conductor material comprising, for example, Al or Cu, which is typically used in semiconductor process steps.

In such a configuration, since the upper electrode wire 110 can be provided independently of the current steering element 106, suitable materials can be selected for them, specifically. In addition, a step of connecting the upper electrode wire 110 to the active element (not shown) via the vertical contact or via filled inside of each of the memory cell holes outside the matrix region can be simplified.

Each of the memory sections 103 comprises the variable resistance layer 104, a portion of a lower electrode wire 101a and a portion of a common electrode 105 between which portions the variable resistance layer 104 is sandwiched. Each of the current steering elements 106 comprises a MIM diode comprising the common electrode 105 which is the metal electrode layer, the upper electrode 108 and the current steering layer 107. In the case where the current steering element 106 comprises the MIM diode in this way, a diode area can be increased and the current steering layer 107 can be thinned. Therefore, a current capacity can be increased and non-uniformity in characteristics can be reduced.

Moreover, the current steering element 106 is not limited to the MIM diode but may be the MSM diode, a pn-junction diode, or a Schottky-junction diode, by using a semiconductor layer as the current steering layer 107. Each of the non-volatile memory devices of Embodiment 3 to Embodiment 5 may have a stacked-layer structure as in the case of the non-volatile memory device of Embodiment 3.

Although in the present embodiment, the current steering element 106 is provided separately for each of the memory sections 103, it may be provided specifically for each of a set of the plurality of memory sections 103.

Numeral modifications and alternative embodiments of the present invention can be made by those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A manufacturing method of a non-volatile memory device of the present invention is useful in fields of a variety of electronic devices because two variable resistance layers which are different in oxygen content from each other can be formed into a hole more easily than a conventional manufacturing method.

REFERENCE SINGS LISTS 5 word line decoder
6 bit line decoder
7 read circuit
10 non-volatile memory device (ReRAM)
11 substrate
12 active element
12a source region
12b drain region
12c gate insulating layer
12d gate electrode
13, 14 interlayer insulating layer
15 lower electrode backing wire
16 interlayer insulating layer
17 variable resistance element
18 variable resistance layer
18a first variable resistance layer
18b second variable resistance layer
19 intermediate electrode (second electrode)
20 current steering element (first current steering element)
21 current steering layer
22 upper electrode wire (third electrode)
23 insulating protective layer (first interlayer insulating layer)
24, 25 vertical contact or via
26 semiconductor circuit wire
27 upper electrode wire (first upper electrode wire)
29 memory cell hole
28 vertical contact or via
30 interlayer insulating layer
30a first insulating layer
30b second insulating layer
31 interlayer insulating layer
32 channel
33 current steering element
34 current steering layer
35 upper electrode
40 non-volatile memory device (ReRAM)
41 second-layer variable resistance element (second-layer memory section)
42 second-layer variable resistance layer
43 second-layer common electrode
44 second-layer current steering element (current steering element)
45 second-layer current steering layer
46 second-layer upper electrode
47 second-layer interlayer insulating layer
48 third-layer interlayer insulating layer
49 second-layer upper electrode wire
50, 51 vertical contact or via
52 fourth-layer interlayer insulating layer
53 third-layer variable resistance element (third-layer memory section)
54 third-layer variable resistance layer
55 third-layer common electrode
56 third-layer current steering element (current steering element)
57 third-layer current steering layer
58 third-layer upper electrode
59 third-layer upper electrode wire
60 insulating protective layer
70 non-volatile memory device (ReRAM)
71 lower electrode wire
72 lower wire
73, 73a connection electrode (first electrode)
75 memory section
76 variable resistance layer
78 current steering element
79 common electrode
80 semiconductor layer
81 upper electrode
82 connection electrode
100 non-volatile memory device (ReRAM)
101 lower electrode wire (first electrode)
101a lower electrode wire
103 memory section
104 variable resistance layer
105 common electrode
106 current steering element
107 current steering layer
108 upper electrode
109 interlayer insulating layer
110 upper electrode wire
151 lower electrode wire (first electrode)
181a first variable resistance material layer
181b second variable resistance material layer
191 intermediate electrode material layer
200 non-volatile memory device (ReRAM)
301 chamber
302 raw material container
303 raw material supply system
304 vacuum indicator (gauge)
305 valve
341 current steering material layer
351 electrode material layer

The invention claimed is:

1. A method of manufacturing a non-volatile memory device, comprising steps of:
    forming a first electrode on a substrate;
    forming an interlayer insulating layer on the first electrode;
    forming a memory cell hole in the interlayer insulating layer such that the memory cell hole penetrates the interlayer insulating layer and exposes the first electrode;
    forming a first variable resistance layer inside of the memory cell hole; and
    forming a second variable resistance layer after the step of forming the first variable resistance layer inside of the memory cell hole; and
    forming a second electrode on the second variable resistance layer, wherein:
    the first variable resistance layer comprises a first transition metal oxide and the second variable resistance layer comprises a second transition metal oxide, the second transition metal oxide being an oxygen-deficient transition metal oxide,
    each of the step of forming the first variable resistance layer and the step of forming the second variable resistance layer includes performing a cycle once or plural times, the cycle including:
        a first step of introducing a source gas composed of molecules containing atoms of a transition metal;
        a second step of removing the source gas after the first step;
        a third step of introducing a reactive gas to form a transition metal oxide after the second step; and
        a fourth step of removing the reactive gas after the third step;
    the step of forming the first variable resistance layer is performed in a state in which the substrate is kept at a temperature at which a self-decomposition reaction of the source gas does not occur and such that the first variable resistance layer is formed to conformally cover a bottom portion and a side wall of the memory cell hole, the first variable resistance layer and the second variable resistance layer are formed in such a manner that at least one condition used for forming the first variable resistance layer and the second variable resistance layer is different such that the second variable resistance layer is oxygen-deficient and an oxygen content of the first variable resistance layer is higher than an oxygen content of the second variable resistance layer, the at least one condition being selected from the group consisting of a temperature of the substrate, an amount of the introduced source gas and an amount of the introduced reactive gas, the step of forming the first variable resistance layer includes performing a first cycle once or plural times, the first cycle including:
  A1 step of introducing the source gas to form a monomolecular layer on the substrate;
  A2 step of removing the source gas after the A1 step;
  A3 step of introducing the reactive gas such that a layer is deposited in a reaction-limited state of the reactive gas, to form the first transition metal oxide which is not oxygen-deficient, after the A2 step; and
  A4 step of removing the reactive gas after the A3 step, the step of forming the second variable resistance layer is performed in a state in which the substrate is kept at a temperature at which the self-decomposition reaction of the source gas occurs, and includes performing a second cycle once or plural times, the second cycle including:
  B1 step of introducing the source gas to form a plurality of atomic layers of the transition metal on the substrate by the self-decomposition reaction;
  B2 step of removing the source gas after the B1 step;
  B3 step of introducing the reactive gas such that a layer is deposited in a supply-limited state of the reactive gas, to form the second transition metal oxide which is oxygen-deficient, after the B2 step; and
  B4 step of removing the reactive gas after the B3 step, the A1, A2, A3 and A4 steps are the first, second, third and fourth steps included in the step of forming the first variable resistance layer, respectively, and the B1, B2, B3 and B4 steps are the first, second, third and fourth steps included in the step of forming the second variable resistance layer, respectively.

2. The method of manufacturing the non-volatile memory device according to claim 1, further comprising:
  forming a semiconductor layer or an insulator layer on the interlayer insulating layer such that the semiconductor layer or the insulator layer covers an entire upper end surface of the second electrode and protrudes outward over the entire upper end surface; and
  forming a third electrode on the semiconductor layer or the insulator layer, to attain a current steering element comprising the second electrode, the semiconductor layer or the insulator layer and the third electrode.

3. The method of manufacturing the non-volatile memory device according to claim 1,
  wherein the transition metal is tantalum, and
  wherein when a tantalum oxide constituting the first variable resistance layer is TaO$_x$, and a tantalum oxide constituting the second variable resistance layer is TaO$_y$, $x \geq 2.1$ and $0.8 \leq y \leq 1.9$ are satisfied.

4. The method of manufacturing the non-volatile memory device according to claim 1, wherein an aspect ratio of the memory cell hole is equal to or greater than 1.

5. A method of manufacturing a non-volatile memory device, comprising steps of:
  forming a first electrode on a substrate;
  forming an interlayer insulating layer on the first electrode;
  forming a memory cell hole in the interlayer insulating layer such that the memory cell hole penetrates the interlayer insulating layer and exposes the first electrode;
  forming a first variable resistance layer inside of the memory cell hole; and
  forming a second variable resistance layer after the step of forming the first variable resistance layer inside of the memory cell hole; and
  forming a second electrode on the second variable resistance layer, wherein:

the first variable resistance layer comprises a first transition metal oxide and the second variable resistance layer comprises a second transition metal oxide, the second transition metal oxide being an oxygen-deficient transition metal oxide, each of the step of forming the first variable resistance layer and the step of forming the second variable resistance layer includes performing a cycle once or plural times, the cycle including:
  a first step of introducing a source gas composed of molecules containing atoms of a transition metal;
  a second step of removing the source gas after the first step;
  a third step of introducing a reactive gas to form a transition metal oxide after the second step; and
  a fourth step of removing the reactive gas after the third step;

the step of forming the first variable resistance layer is performed in a state in which the substrate is kept at a temperature at which a self-decomposition reaction of the source gas does not occur and such that the first variable resistance layer is formed to conformally cover a bottom portion and a side wall of the memory cell hole, the first variable resistance layer and the second variable resistance layer are formed in such a manner that at least one condition used for forming the first variable resistance layer and the second variable resistance layer is different such that the second variable resistance layer is oxygen-deficient and an oxygen content of the first variable resistance layer is higher than an oxygen content of the second variable resistance layer, the at least one condition being selected from the group consisting of a temperature of the substrate, an amount of the introduced source gas and an amount of the introduced reactive gas, the step of forming the first variable resistance layer includes performing a first cycle once or plural times, the first cycle including:
  A1 step of introducing the source to form a mono-molecular layer on the substrate;
  A2 step of removing the source gas after the A1 step;
  A3 step of introducing the reactive gas such that a layer is deposited in a reaction-limited state of the reactive gas, to form the first transition metal oxide which is not oxygen-deficient, after the A2 step; and
  A4 step of removing the reactive gas after the A3 step, the step of forming the second variable resistance layer is performed in a state in which the substrate is kept at a temperature at which the self-decomposition reaction of the source gas occurs, and includes performing a second cycle once or plural times, the second cycle including:

B1 step of introducing the source gas to form a plurality of atomic layers of the transition metal on the substrate by the self-decomposition reaction;

B2 step of removing the source gas after the B1 step;

B3 step of introducing the reactive gas such that an amount of the introduced reactive gas is less than an amount of the reactive gas introduced in the A3 step of forming the first variable resistance layer, to form the second transition metal oxide which is oxygen-deficient, after the B2 step; and B4 step of removing the reactive gas after the B3 step, the A1, A2, A3 and A4 steps are the first, second, third and fourth steps included in the step of forming the first variable resistance layer, respectively, and the B1, B2, B3 and B4 steps are the first, second, third and fourth steps included in the step of forming the second variable resistance layer, respectively.

6. The method of manufacturing the non-volatile memory device according to claim 5, wherein:

a total gas pressure within a chamber in the A1 is lower than a total gas pressure within the chamber in the B1, and a total gas pressure within the chamber in the A3 is lower than a total gas pressure within the chamber in the B3.

7. The method of manufacturing the non-volatile memory device according to claim 5, further comprising:

forming a semiconductor layer or an insulator layer on the interlayer insulating layer such that the semiconductor layer or the insulator layer covers an entire upper end surface of the second electrode and protrudes outward over the entire upper end surface; and forming a third electrode on the semiconductor layer or the insulator layer, to attain a current steering element comprising the second electrode, the semiconductor layer or the insulator layer and the third electrode.

8. The method of manufacturing the non-volatile memory device according to claim 5, wherein the transition metal is tantalum, and wherein when a tantalum oxide constituting the first variable resistance layer is $TaO_x$ and a tantalum oxide constituting the second variable resistance layer is $TaO_y$, $x \geq 2.1$ and $0.8 \leq y \leq 1.9$ are satisfied.

9. The method of manufacturing the non-volatile memory device according to claim 5, wherein an aspect ratio of the memory cell hole is equal o or greater than 1.

* * * * *